United States Patent [19]

Morley, Jr. et al.

[11] Patent Number: 5,357,251
[45] Date of Patent: Oct. 18, 1994

[54] ELECTRONIC FILTERS, SIGNAL CONVERSION APPARATUS, HEARING AIDS AND METHODS

[75] Inventors: Robert E. Morley, Jr., Richmond Heights; A. Maynard Engebretson, Ladue; George L. Engel, Crestwood; Thomas J. Sullivan, Kirkwood, all of Mo.

[73] Assignee: Central Institute For The Deaf, St. Louis, Mo.

[21] Appl. No.: 56,054

[22] Filed: Apr. 30, 1993

Related U.S. Application Data

[60] Division of Ser. No. 792,706, Nov. 15, 1991, Pat. No. 5,225,836, which is a division of Ser. No. 180,170, Apr. 11, 1988, Pat. No. 5,111,419, which is a continuation-in-part of Ser. No. 172,266, Mar. 23, 1988, Pat. No. 5,016,280.

[51] Int. Cl.$^5$ .............................................. H03M 1/12
[52] U.S. Cl. ................................... 341/172; 341/155
[58] Field of Search ................. 341/138, 150, 155, 172

[56] References Cited

U.S. PATENT DOCUMENTS

| | | | |
|---|---|---|---|
| 3,745,555 | 7/1973 | Carbrey | 341/172 |
| 3,889,108 | 6/1975 | Cantrell | 364/724.19 |
| 3,906,488 | 9/1975 | Suarez-Gartner | 341/108 |
| 4,038,536 | 7/1977 | Feintuch | 364/724.19 |
| 4,187,413 | 2/1980 | Moser | 179/107 FD |
| 4,384,276 | 5/1983 | Kelley et al. | 340/347 |
| 4,389,540 | 6/1983 | Nakamura et al. | 364/724.15 |
| 4,451,820 | 5/1984 | Kapral | 340/347 |
| 4,508,940 | 4/1985 | Steeger | 179/107 FD |
| 4,513,279 | 4/1985 | Kapral | 340/347 |
| 4,548,082 | 10/1985 | Engebretson et al. | 73/585 |
| 4,649,505 | 3/1987 | Zinser, Jr. et al. | 364/724.19 |
| 4,695,970 | 9/1987 | Renner et al. | 364/724.15 |
| 4,731,850 | 3/1988 | Levitt et al. | 381/68.2 |
| 4,771,395 | 9/1988 | Watanabe et al. | 364/724.16 |
| 4,988,900 | 1/1991 | Fensch | 307/494 |
| 5,225,836 | 7/1993 | Morley, Jr. et al. | 341/150 |
| 5,258,759 | 11/1993 | Cauwinberghs et al. | 341/150 |

FOREIGN PATENT DOCUMENTS

| | | |
|---|---|---|
| 0252205A2 | 1/1988 | European Pat. Off. |
| 57-162592 | 3/1981 | Japan |
| 60-96997A | 5/1985 | Japan |
| 83/02212 | 6/1983 | PCT Int'l Appl. |

OTHER PUBLICATIONS

Blachman, "Band-Pass Nonlinearities", *IEEE Trans. on Info. Theory*, Apr. 1964, pp. 162-164.

Kingsbury et al., "Digital Filtering Using Logarithmic Arithmetic", *Electron Lett.* 7:56-58 (1971), pp. 215-217.

Duke, "RC Logarithmic Analog-to -Digital (LAD) Conversion", *IEEE Trans. Instrum. & Meas.*, Feb. 1971, pp. 74-76.

(List continued on next page.)

*Primary Examiner*—Marc S. Hoff
*Attorney, Agent, or Firm*—Senniger, Powers, Leavitt & Roedel

[57] ABSTRACT

An electronic filter for filtering an electrical signal. Signal processing circuitry therein includes a logarithmic filter having a series of filter stages with inputs and outputs in cascade and respective circuits associated with the filter stages for storing electrical representations of filter parameters. The filter stages include circuits for respectively adding the electrical representations of the filter parameters to the electrical signal to be filtered thereby producing a set of filter sum signals. At least one of the filter stages includes circuitry for producing a filter signal in substantially logarithmic form at its output by combining a filter sum signal for that filter stage with a signal from an output of another filter stage. The signal processing circuitry produces an intermediate output signal, and a multiplexer connected to the signal processing circuit multiplexes the intermediate output signal with the electrical signal to be filtered so that the logarithmic filter operates as both a logarithmic prefilter and a logarithmic postfilter. Other electronic filters, signal conversion apparatus, electroacoustic systems, hearing aids and methods are also disclosed.

20 Claims, 12 Drawing Sheets

OTHER PUBLICATIONS

Suarez et al., "All-MOS Charge Redistribution Analog-to-Digital Conversion Techniques-Part II", Reprinted From *IEEE J. Solid-State Circuits,* vol. SC-10, Dec. 1975, pp. 379-385, actual pp. 122-128.

Edgar et al., "FOCUS Microcomputer Number System", Communic. of the ACM, Mar. 1979, vol. 22, #3, pp. 166-177.

Kurokawa et al., "Error Analysis of Recursive Digital Filters Implemented with Logarithmic Number Systems", IEEE Trans. on Acoustics, Speech, & Sig. Proces., vol. ASSP-28, #6, Dec. 1980, pp. 706-715.

Allen et al., *Switched Capacitor Circuits,* 1984, title pages & pp. 72-87, 504-547.

Morley, "Breaking the Frequency Barrier", IEEE Potentials, Feb. 1987, vol. 6, #1, cover, pp. 1, 32-35.

Engebretson et al., "Development of an ear-level digital hearing aid and computer-assisted fitting procedure: An interim report", *J. of Rehab. Research & Develop.,* vol. 24, No. 4, pp. 55-64, Fall 1987.

Lang et al., "Integrated-Circuit Logarithmic Arithmetic Unis", Dept. of Elec. Eng. & Comp. Science, Mass. Inst. of Tech., face sheet, 27 unnumbered pages, 1988.

Lang, "Analysis and Design of Digital Signal Processors Which Utilize Logarithmic Arithmetic", Mass. Inst. of Tech., 32 unnumbered pages, 1988.

Wang et al., "The Analog Circuit Design for the Pipeline A/D Converter", Dept. of Elec. Engrng., Univ. of Calif., pp. 307-310, 1985.

Engrebretson et al., "A Wearable, Pocket-Sized Processor for Digital Hearing Aid and Other Hearing Prostheses Applications", Central Institute for the Deaf, pp. 1-4, 1986.

Morley et al., "A Multiprocessor Digital Signal Processing System for Real-Time Audio Applications", *IEEE Trans. on Acous., Speech, & Signal Proces.,* vol. ASSP-34, No. 2, Apr. 1986, pp. 225-231.

"Hearing Aids Are Going Digital", *Electronics,* Jan. 22, 1987, pp. 108.

Ohara et al., "A CMOS Programmable Self-Calibrating 13-bit Eight-Channel Data Acquistion Peripheral", *IEEE J. of Solid-State Circuits,* vol. SC-22, No. 6, Dec. 1987, pp. 930-938.

Analog Devices, "CMOS Logarithmic D/A Converter", Digital-To-Analog Converters, vol. 1, pp. 10-91, 1988.

"Re-Thinking the DSP Design Approach", single page, unnumbered, 1988.

D. Preves et al., *Hearing Instruments,* "A Feedback Stabilizing Circuit for Hearing Aids", vol. 37, No. 4, Apr. 1986, pp. 34, 36, 39-41 and 51.

Vainio et al., "Logarithmic Arithmetic in FIR Filters", *IEEE Transactions on Circuits and Systems,* CAS-33 (1986), Aug., No. 8, 3 unnumbered pages.

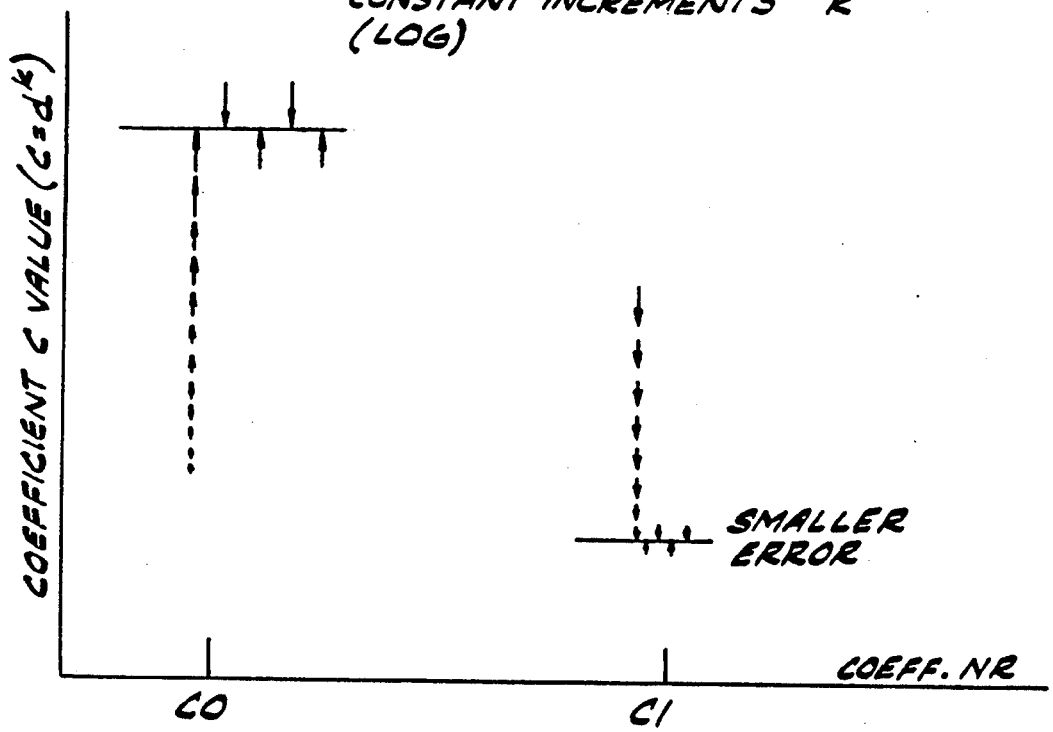
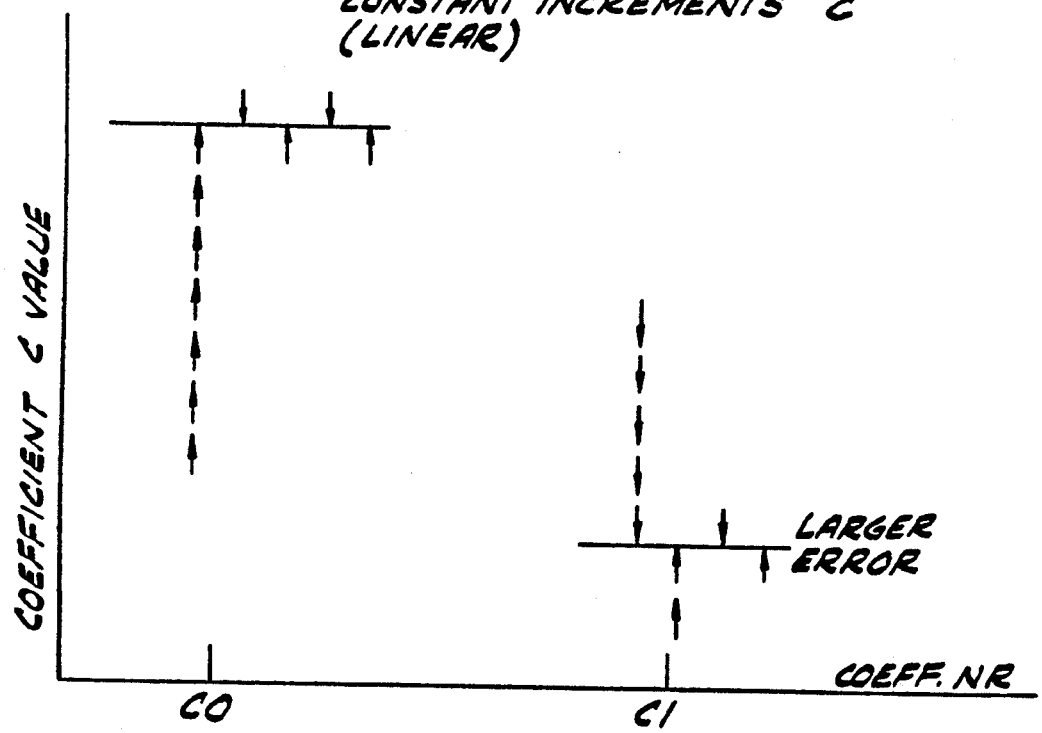

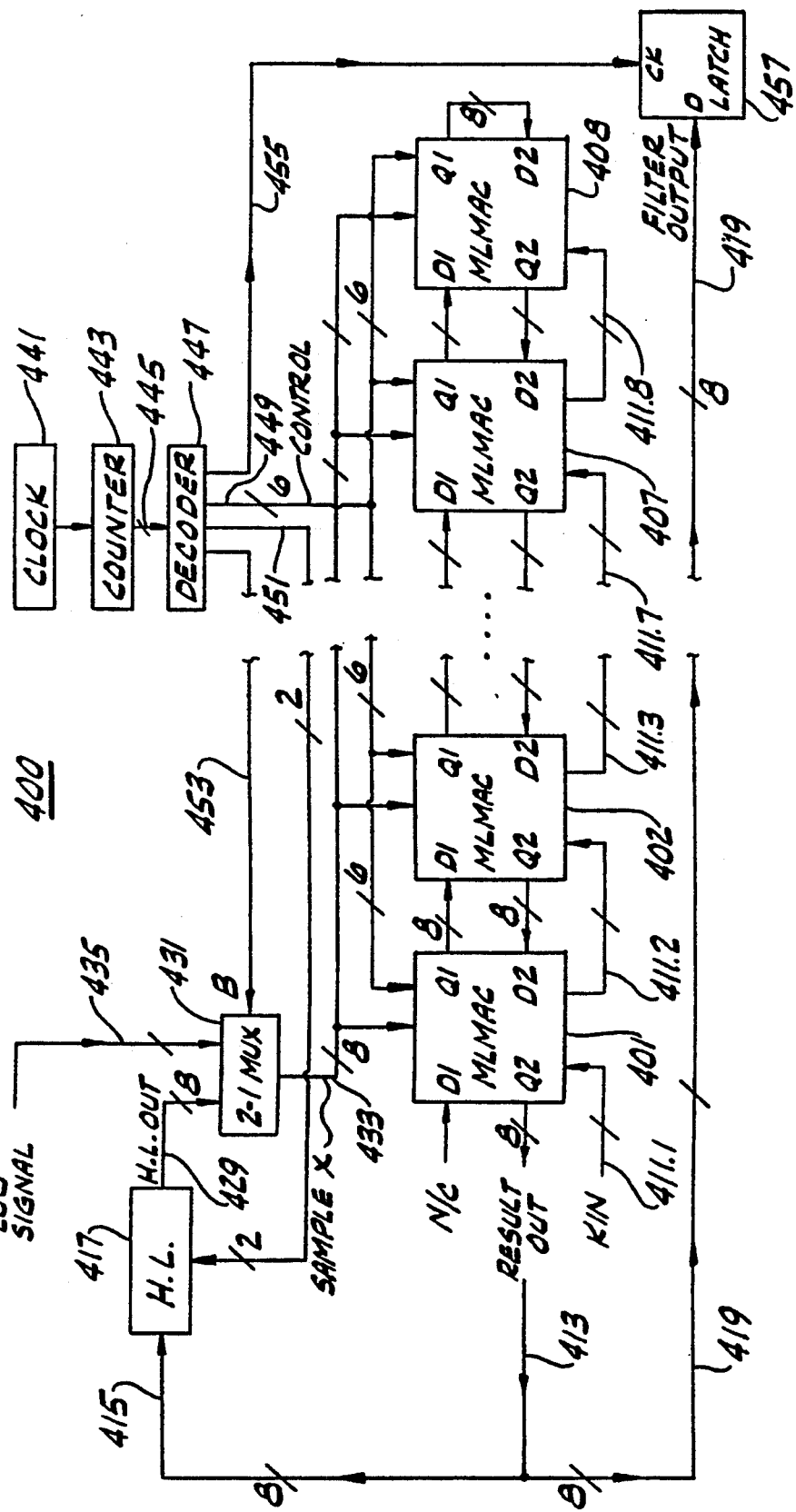

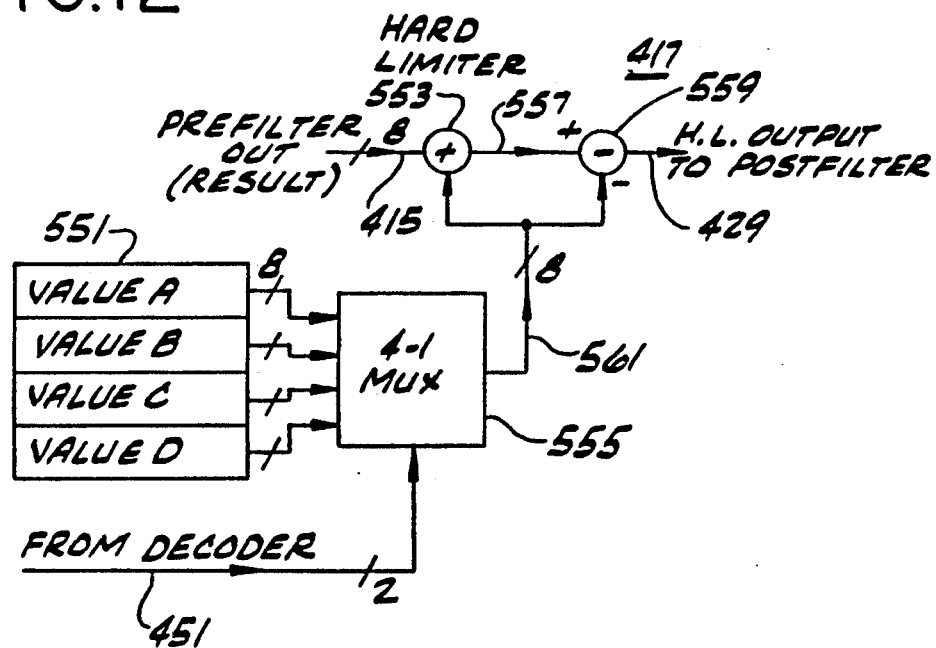
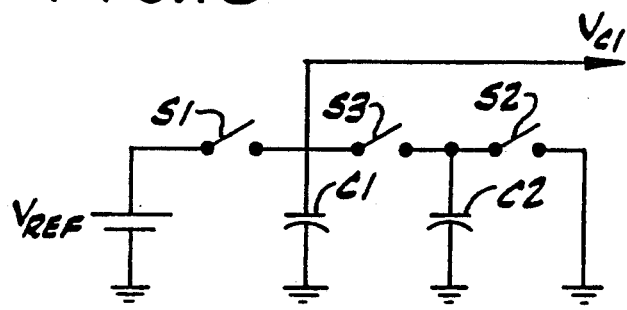

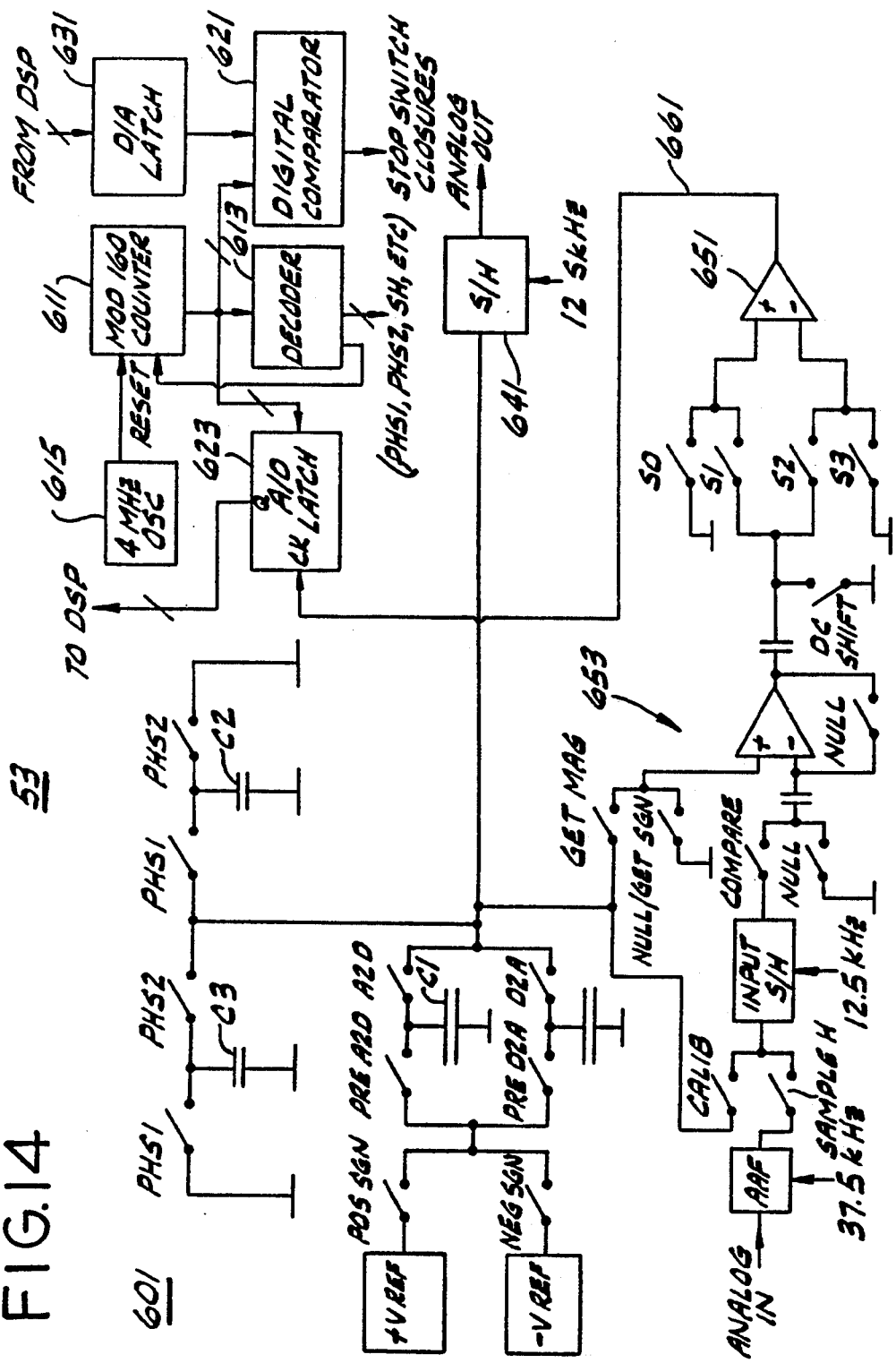

ELECTRONIC FILTERS, SIGNAL CONVERSION APPARATUS, HEARING AIDS AND METHODS

GOVERNMENT SUPPORT

This invention was made with U.S. Government support under Veterans Administration Contract VA KV 674P857 and National Aeronautics and Space Administration (NASA) Research Grant No. NAG10-0040. The U.S. Government has certain rights in this invention.

CROSS-REFERENCE TO RELATED APPLICATION

The present application is a divisional of application Ser. No. 07/72,706, for "ELECTRONIC FILTERS, REPEATED CHARGE REDISTRIBUTION SIGNAL CONVERSION APPARATUS, HEARING AIDS AND METHODS" filed Nov. 15, 1991 by the inventors herein which is a divisional of U.S. Pat. No. 5,111,419 filed Apr. 11, 1988, Ser. No. 180,170, which is a continuation-in-part of U.S. Pat. No. 5,016,280 filed Mar. 23, 1988, Ser. No. 172,266, which applications are hereby incorporated by reference herein.

FIELD OF THE INVENTION

The present invention relates to electronic filters, signal conversion apparatus and methods of operation for electronic systems generally. Applications in electro-acoustic systems such as hearing aids and public address systems are also discussed.

BACKGROUND OF THE INVENTION

Without limiting tile scope of the present invention in general, the background of the invention is described by way of example in its application to hearing aids.

A person's ability to hear speech and other sounds well enough to understand them is clearly important in employment and many other daily life activities. Improvements in hearing aids which are intended to compensate or ameliorate hearing deficiencies of hearing impaired persons are consequently important not only to these persons but also to the community at large.

Electronic hearing aids and methods are discussed in coassigned U.S. Pat. 4,548,082 by Engebretson (an inventor herein), Morley (an inventor herein) and Popelka, which is hereby also incorporated herein by reference as an example of an electronic system in which the present invention can be used.

An article on electronic hearing aid problems by one of the present inventors (Morley) is "Breaking the frequency barrier" *IEEE Potentials*, February 1987, pp. 32-35.

"Digital Filtering Using Logarithmic Arithmetic" by N. G. Kingsbury et al., Electronics Letters 7: 56-58 (1971) discusses multiplication by adding logarithms, and using a read-only-memory to do addition and subtraction. Logarithmic analog-to-digital and digital-analog conversion are mentioned.

"RC Logarithmic Analog-to-Digital (LAD) Conversion" by E. J. Duke, IEEE Transactions on Instrumentation and Measurement, February, 1971, utilizes an RC circuit approach to conversion.

"All-MOS Charge Redistribution Analog-to-Digital Conversion Techniques-Part II" by R. E. Suarez et al., *IEEE J. Solid-State Circuits*, vol. SC-10, pp. 379-385, December 1975, describes a two-capacitor successive approximation technique for linear conversion of each bit in a digital word.

Moser U.S. Pat. No. 4,187,413 describes a hearing aid with a finite impulse response (FIR) filter and states that it can be implemented using only one multiplier in a time multiplexed configuration.

Steager U.S. Pat. No. 4,508,940 suggests a hearing aid based on sampled-data analog circuits which has a plurality of parallel signal channels each including a bandpass filter, controlled gain amplifier with volume control, circuits for non-linear signal processing and bandpass filter.

Conventionally, a microphone in the hearing aid generates an electrical output from external sounds. An amplifying circuit in the aid provides a filtered version of the electrical output corresponding to the sounds picked up by the microphone. The filtering can be due to an inherent characteristic of the amplifying circuit or may be deliberately introduced. The amplified and filtered output of the hearing aid is fed to an electrically driven "receiver" for emitting sound into the ear of the user of the hearing aid. (In the hearing aid field, a receiver is the name of an electronic element analogous to a loudspeaker or other electroacoustic transducer.) Some of the sound emitted by the receiver returns to the microphone to add a feedback contribution to the electrical output of the microphone. The feedback is amplified by the hearing aid, and ringing or squealing often arise in an endlessly circular feedback process.

The commercial viability of a hearing aid having sophisticated performance features as described in coassigned U.S. Pat. No. 4,548,082 is strongly tied to the premise that electronic circuits can be realized in which the total power consumption does not exceed a few milliwatts. Given the computationally intensive nature of the signal processing required to implement filtering used in shaping the desired frequency selective response as well as the power needed by numerous circuits needed for signal conversion and amplification, this is an extremely difficult task. Only a few hundred microwatts are available for the filtering in a viable hearing aid.

Sophisticated performance requirements imply a massive computational burden. It is believed that millions of arithmetic calculations per second are probably needed in a sophisticated hearing aid. Generally speaking, electronic circuitry dissipates more power as performance increases, unless basic improvements can be found.

SUMMARY OF THE INVENTION

Among the objects of the present invention are to provide improved electronic filters, electronic signal conversion apparatus, hearing aids, and methods which can provide sophisticated features compatible with VLSI and low power constraints; to provide new circuit subcombinations which can be used to improve electronic systems generally; to provide further improved electronic filters, electronic signal conversion apparatus, hearing aids, and methods which substantially prevent undesirable feedback ringing and squealing; and to provide improved electronic filters, electronic signal conversion apparatus, hearing aids and other systems which are reliable, compact and economical.

Generally, one form of the invention is an electronic filter for filtering an electrical signal. Signal processing circuitry therein includes a logarithmic filter having a series of filter stages with inputs and outputs in cascade and respective circuits associated with the filter stages for storing electrical representations of filter parameters. The filter stages include circuits for respectively adding the electrical representations of the filter parameters to the electrical signal to be filtered thereby producing a set of filter sum signals. At least one of the filter stages includes circuitry for producing a filter signal in substantially logarithmic form at its output by combining a filter sum signal for that filter stage with a signal from an output of another filter stage. The signal processing circuitry produces an intermediate output signal, and a multiplexer connected to the signal processing circuit multiplexes the intermediate output signal with the electrical signal to be filtered so that the logarithmic filter operates as both a logarithmic prefilter and a logarithmic postfilter.

Generally, another form of the invention is an electronic filter for filtering an electrical signal, including a series of filter stages responsive to the electrical signal and having inputs and outputs in cascade. Storage circuitry stores electrical representations of filter parameters for the filter stages. The series of filter stages include circuitry for filtering signals through the series of filter stages from a first to a last of the filter stages and then filtering signals back through the series of filter stages from the last to the first of the filter stages to produce a filtered signal output.

Generally, a further form of the invention is an electronic filter for filtering an electrical signal, including a logarithmic filter having a series of filter stages with inputs and outputs in cascade and respective circuitry associated with the filter stages for storing electrical representations of filter parameters corresponding to logarithms of values of filter coefficients. The filter stages include adding circuitry for respectively adding the electrical representations of the filter parameters to the electrical signal to be filtered thereby producing a set of filter sum signals. At least one of the filter stages includes a circuit for producing a filter signal in substantially logarithmic form at its output by combining a filter sum signal for that filter stage with a signal from an output of another filter stage. Further included is electronic control means for continually altering the electrical representations to vary each filter coefficient in magnitude in substantially constant percentage amounts of the value of that coefficient at any given time.

In general, an additional form of the invention is an electronic filter that has first and second VLSI dies and logarithmic analog-to-digital and digital-to-analog signal conversion circuitry fabricated on the first VLSI die and including a pair of capacitors having respective electrical charges and a circuit for redistributing the charges repeatedly a variable number of times, wherein the variable number relates digital to analog. A logarithmic filter-limit-filter circuit is fabricated on the second VLSI die and has a digital input and a digital output respectively connected to the logarithmic signal conversion circuitry on the first VLSI die.

Generally, still another form of the invention is an electronic signal conversion apparatus including a circuit for temporarily holding a digital value which is to be converted to analog form. Switch circuits execute selective operations including selectively charging at least one of first and second capacitors, selectively discharging at least one of the first and second capacitors, and selectively connecting the first and second capacitors so that a redistribution of charge between them occurs. Further circuitry, responsive to the circuit for temporarily holding the digital value which is to be converted to analog form, operates the switch circuit to make it perform a sequence of the selective operations among which operations the redistribution of charge repeatedly occurs a number of times, wherein the number is a function of the digital value which is to be converted to analog form, so that the voltage across at least one of the capacitors after the operations are executed is an analog voltage to which the digital value is converted.

Generally, a still further additional form of the invention is an electronic signal conversion apparatus including a circuit for temporarily holding a sample of an analog signal which is to be converted to a digital value. Switch circuitry executes selective operations including selectively charging at least one of the first and second capacitors, selectively discharging at least one of the first and second capacitors, and selectively connecting the first and second capacitors so that a redistribution of charge between them occurs. Another circuit operates the switch circuit to make it perform a sequence of the selective operations among which operations the redistribution of charge repeatedly occurs a number of times until a predetermined electrical condition, involving the sample of the analog signal, occurs. A digital value is then produced as a function of the number of times the redistribution of charge occurs, so that the digital value so produced when the operations are executed is the digital value to which the sample of the analog signal is converted.

Other forms of the invention are also disclosed, including systems and circuits and methods for operating them.

Other objects and features will be in part apparent and in part pointed out hereinafter.

BRIEF DESCRIPTION OF THE DRAWING

FIG. 8 is a graph of coefficient C value versus coefficient number showing adaption in constant percentage units in inventive circuitry;

FIG. 9 is a graph of coefficient C value versus coefficient number showing adaption in constant increments in a linear adaption approach;

FIG. 10 is a block diagram of a logarithmic filter-limit-filter of the invention;

FIG. 12 is a block diagram of a hard limiter circuitry of the invention used in FIG. 10;

FIG. 13 is a schematic diagram of a switched capacitor arrangement operated by methods of the invention;

FIG. 14 is a partially block, partially schematic diagram of a logarithmic analog-to-digital, digital-to-analog signal conversion apparatus of the invention.

Corresponding reference characters indicate corresponding parts throughout the several views of the drawings.

DETAILED DESCRIPTION OF PREFERRED EMBODIMENTS

Figure 1:
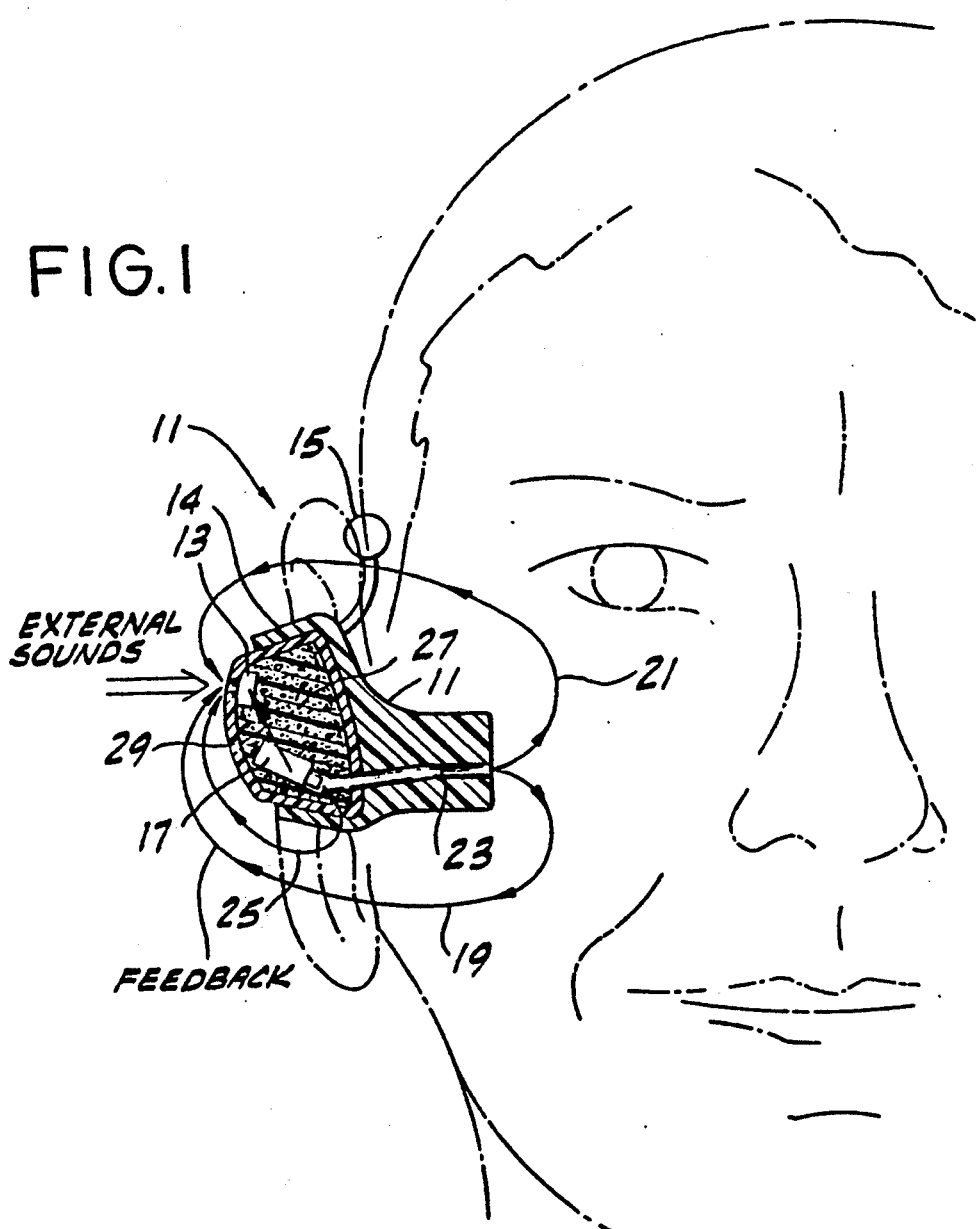
FIG. 1 is a pictorial of a user with a hearing aid of the invention including an electronic filter according to the invention, part of the hearing aid shown in cross-section.

In FIG. 1 a hearing aid 11 receives external sounds at an input microphone 13 in an earpiece 14. Microphone 13 generates an electrical output from sounds external to the user of the hearing aid for an over-the-ear-unit 15 which produces an electrical output for a receiver or transducer 17 that emits filtered and amplified sound from earpiece 14 into the ear of the user of the hearing aid. (In another hearing aid, not shown, the microphone 13 and receiver 17 are in a behind-the-ear (BTE) unit and not in an earpiece, and the improvements described herein are equally applicable to this and other units.)

For purposes of the present disclosure it is important to note that some of the sound emitted by receiver 17 returns to the microphone 13 as feedback indicated by arrows such as 19 and 21 from the opening of a channel 23 by which receiver 17 communicates with the ear canal of the user. Other feedback passes through the side of earpiece 14 and takes a shorter path to the input microphone as illustrated by arrow 25. Some sound 29 feeds back directly from receiver 17 through interior absorber material 27 of earpiece 14 to the microphone 13.

Feedback is disadvantageously associated with squealing, ringing, erratic operation and instability in the operation of hearing aid 11. Accordingly it is desirable to find some way to permit hearing aid 11 to operate more satisfactorily even though feedback according to the numerous paths indicated by arrows 19, 21, 25 and 29 unavoidably occurs.

Figure 2:
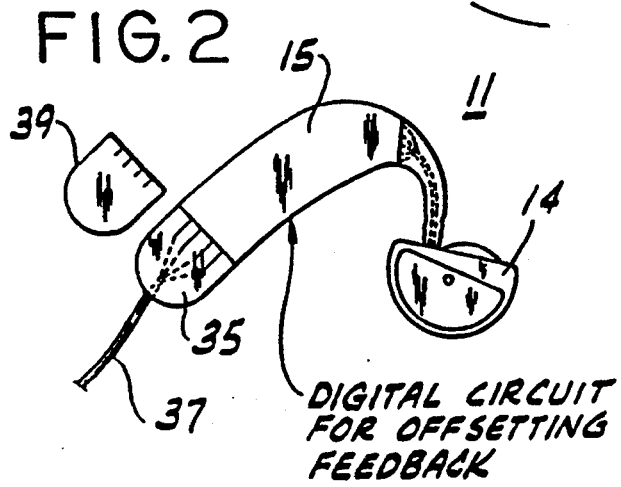
FIG. 2 is a pictorial side view of a hearing aid of the prior art having a digital circuit for offsetting feedback.

FIG. 2 shows a side view of hearing aid 11 with its over-the-ear unit 15 which includes filtering and amplifying circuitry. In a clinical fitting procedure, unit 15 is loaded with digital information through a connector 35 connected by a cord 37 from a host computer system such as that described in U.S. Pat. 4,548,082 which is incorporated herein by reference. After the hearing aid 11 has been loaded at the clinic with information which suits it to ameliorate the particular hearing deficiency of the user, connector 35 is detached from the rest of the hearing aid and replaced with a battery pack 39 for convenient daily use. One type of preferred embodiment is improved with inventive feedback offsetting circuitry that requires no additional information from the host system to govern the offsetting operations.

Hearing aid features, requested by audiologists on the basis of past experiences in clinical practice and research, are in excess of those provided by any aid commercially available to date. Not only is this gap is believed to be unbridgable by using existing unsophisticated analog amplifier components, but also digital signal processing (DSP) strains the power budget of a multichannel, ear-level, battery-operated hearing aid. The power drain of current general purpose digital signal processors demands frequent replacement of batteries which impedes acceptance by the very public who need extensive processing capability most.

Figure 3:
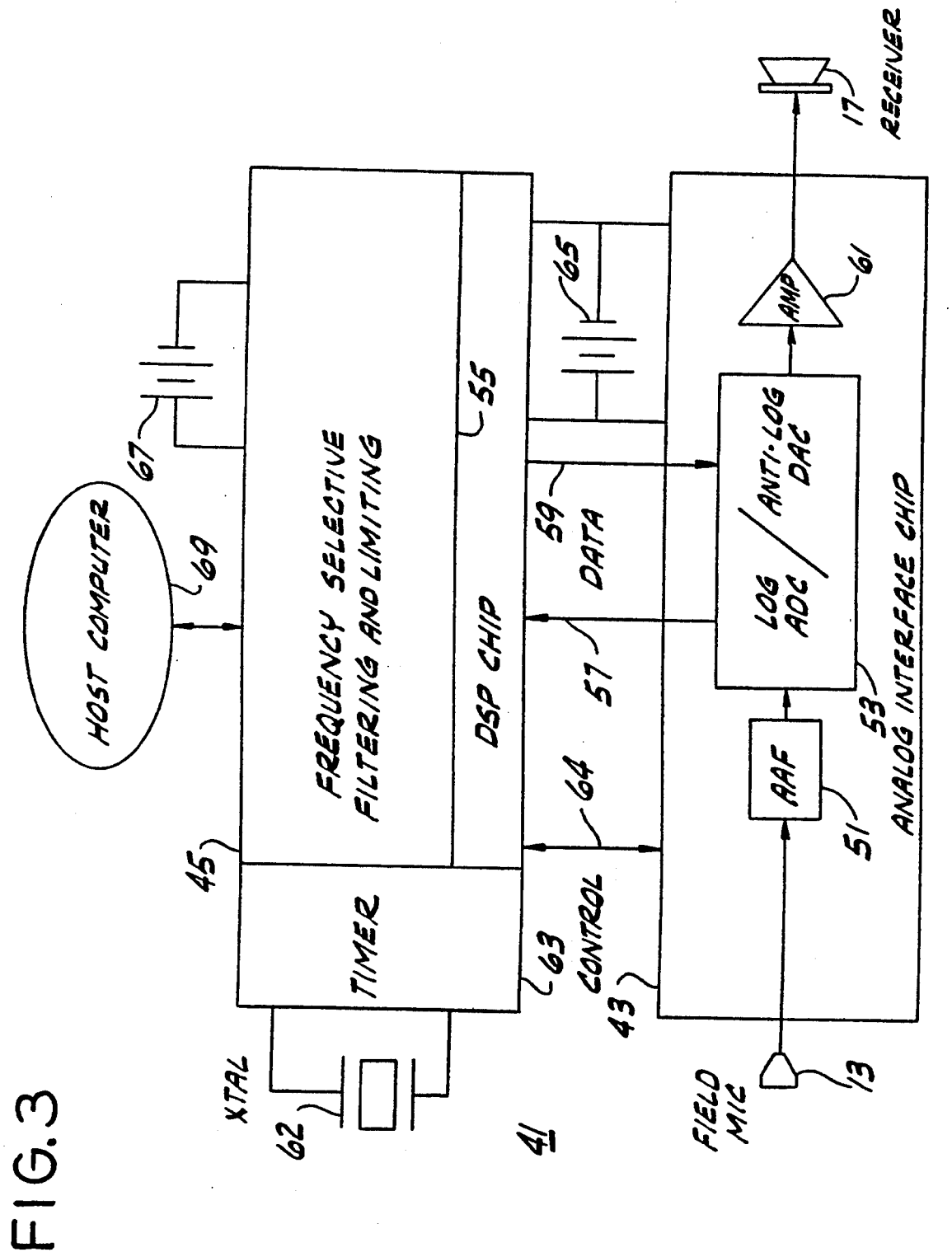
FIG. 3 is a partially block, partially pictorial diagram of an inventive two-chip digital hearing aid.

FIG. 3 shows an inventive two chip VLSI based battery-operated hearing aid 41. VLSI, or very large scale integration, involves the fabrication of thousands of microscopic electronic components on a chip, die or substrate. The hearing aid is suitably implemented in either analog VLSI or digital VLSI form, and digital embodiments are described herein for purposes of example only. One chip or VLSI die 43 is responsible for data acquisition and reconstruction while a second chip or VLSI die 45 is dedicated to the DSP circuitry. A custom digital signal processor, potentially capable of performing over 3 million multiply accumulate operations per second while consuming less than a fraction of a milliwatt, is fabricated on chip 45 to implement a four-channel hearing aid. Power consumption is minimized while maintaining a wide dynamic range through the use of sign/logarithm arithmetic. This capability will allow the processing of several hundred filter taps with a 12.5 kHz sampling rate.

Advantageously, the system architecture is tailored to provide the essential functions and to allow reconfiguration of the signal processing elements to implement a variety of hearing aid designs. The VLSI digital hearing aid 41 has a power consumption that compares favorably with conventional analog units.

In FIG. 3 input microphone, or field microphone, 13 senses external sounds and produces an electrical output for an antialiasing filter AAF 51 for low pass filtering and cutoff at a Nyquist frequency of about 6 kHz. Logarithmic analog-to-digital and digital-to-analog signal conversion circuitry 53 is fabricated on die 43 and has a pair of capacitors having respective electrical charges and a circuit for redistributing the charges repeatedly a variable number of times, which variable number relates digital to analog. An all-hardware logarithmic filter-limit-filter circuit 55 fabricated on die 45 has a digital input 57 and a digital output 59 connected to the logarithmic signal conversion circuitry 53. Circuit 55 acts as a digital signal processor employing sign-/logarithm arithmetic and offering extremely low power consumption. The analog microphone output (filtered by AAF 51) is connected to the logarithmic signal conversion circuitry 53 for conversion to digital form for the input 57 of the logarithmic filter-limit-filter circuit 55. Receiver 17 is an output transducer connected via its output amplifier 61 elsewhere to the logarithmic signal conversion circuitry 53 which converts the digital signal at output 59 of the logarithmic filter-limit-filter circuit 55 to analog form for receiver 17. Timing for the circuits is provided by a piezoelectric crystal 62, associated timer circuit 63 and control lines 64.

Two separate power sources such as a main battery 65 and a parameter retention battery 67 are employed to separate relatively high-power-consumption circuitry in chips 43 and 45 from a parameter memory in chip 45. The parameters, downloaded from a host computer 69 through a serial interface as described in coassigned U.S. Pat. No. 4,548,082 incorporated by reference and as further described herein, are all that need to be altered to fit the response of the digital hearing aid 41 to many hearing-impaired patients. Hence, although the main battery 65 may discharge over a period of days, the parameters that are specific to the patient are retained by separate battery 67 for an extended period (a year or more).

As thus described, one chip 43 is an Analog Interface Chip (AIC) responsible for data acquisition and reconstruction while the second chip 45 is dedicated to the specific DSP circuitry. AIC chip 43 contains an input preamplifier with anti-aliasing filter 51. Conversion circuitry 53 is also regarded as acting as a compressor and expander to convert the analog input to a logarithmically encoded digital word and the digital output samples back to a linear analog voltage. Use of logarithmic circuitry permits substantially reduced power consumption by the DSP chip 45. The DSP chip 45 accepts logarithmically encoded data from the ADC output of the AIC chip 43, processes it in accordance with the desired hearing-aid response, and then passes the result to the DAC function of conversion circuitry 53 for conversion back to analog, filtering and driving the output transducer.

Figure 4:
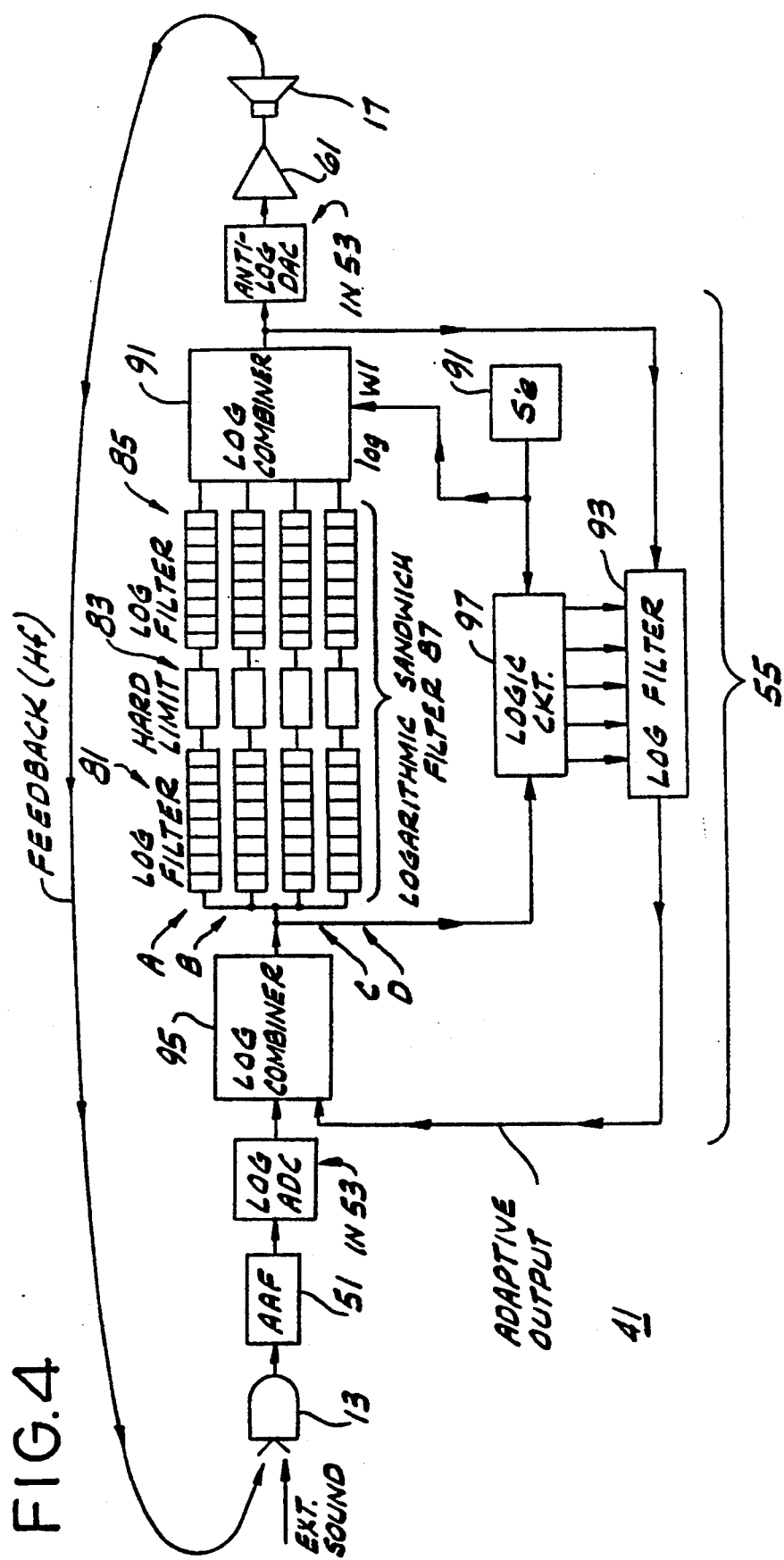
FIG. 4 is an electrical block diagram showing inventive circuitry for the hearing aid of FIG. 3.

In FIG. 4, the system of FIG. 3 is shown in block diagram form without regard to arrangement on the chips. Further description of circuit 55 now refers to FIG. 4. Circuit 55 acts like a bank of four bandpass filter channels A, B, C and D in a logarithmic domain in which the gain and maximum power output of each channel can be controlled independently to shape the desired response. In concept, each channel has a bandpass logarithmic filter 81 called a prefilter followed by a hard limiter 83 and a bandpass logarithmic postfilter 85 that removes distortion introduced by the hard limiter 83. This nonlinear combination is called a filter-limit-filter logarithmic digital filter or logarithmic sandwich filter 87.

The logarithmic operations for filtering purposes herein are now contrasted with the linear operations of a conventional finite impulse response (FIR) filter.

One of the principal factors governing the power consumption of a digital filter is the wordlength used. In a filter employing linear arithmetic in which the numbers stored in the registers are directly proportional to the signal amplitudes, the accuracy of a number depends on its magnitude. But for adequate signal-to-noise ratio and a reasonable wordlength, the dynamic range of the filter is severely limited.

Moreover, the distribution of speech amplitudes, often modeled as a Laplacian, has several implications with regard to choosing an appropriate number system. It is important that any proposed number system concentrate the available resolution near zero while retaining cognizance of distant states. In the context of information theory it can be shown that for a given number of code words the maximum information rate through a channel is achieved when all code words are equally likely to be transmitted. If the digital code words used to represent instantaneous speech pressures are uniformly distributed over a given range, those code words representing small changes in pressure will have a much higher probability of being used than those words which code larger changes in pressure.

In the embodiment of FIG. 4 computational processes use numbers proportional to the logarithm of the signal amplitude. Sign/logarithm arithmetic is especially well-suited to a digital hearing aid application, fulfilling the requirements for wide dynamic range (75 dB), small wordsize, and sufficient signal-to-noise ratio (SNR). RMS signal-to-quantizing noise ratios in excess of 30 dB are easily attainable with an 8-bit sign-/logarithm representation. Because of the logarithmic nature of the number system, the RMS signal-to-noise ratio is a constant, independent of signal magnitude, distribution, or frequency spectrum. The logarithmic data representation permits data compression without compromising the fidelity of the signals while reducing the power consumption and size of the integrated circuits dramatically.

While filtering in the logarithmic mode shows great promise, it results in an extremely inefficient implementation on presently available commercial digital signal processors such as the Texas Instruments TMS320. Over twenty times as many clock cycles are required to process a single FIR tap. A special purpose processor as described herein changes this situation dramatically by processing the samples in a much more efficient manner. Also, low-power, precision signal conversion circuitry described herein for the acquisition and reconstruction of the sampled data is key to the successful attainment of a practical ear-level digital hearing aid.

Figure 5:
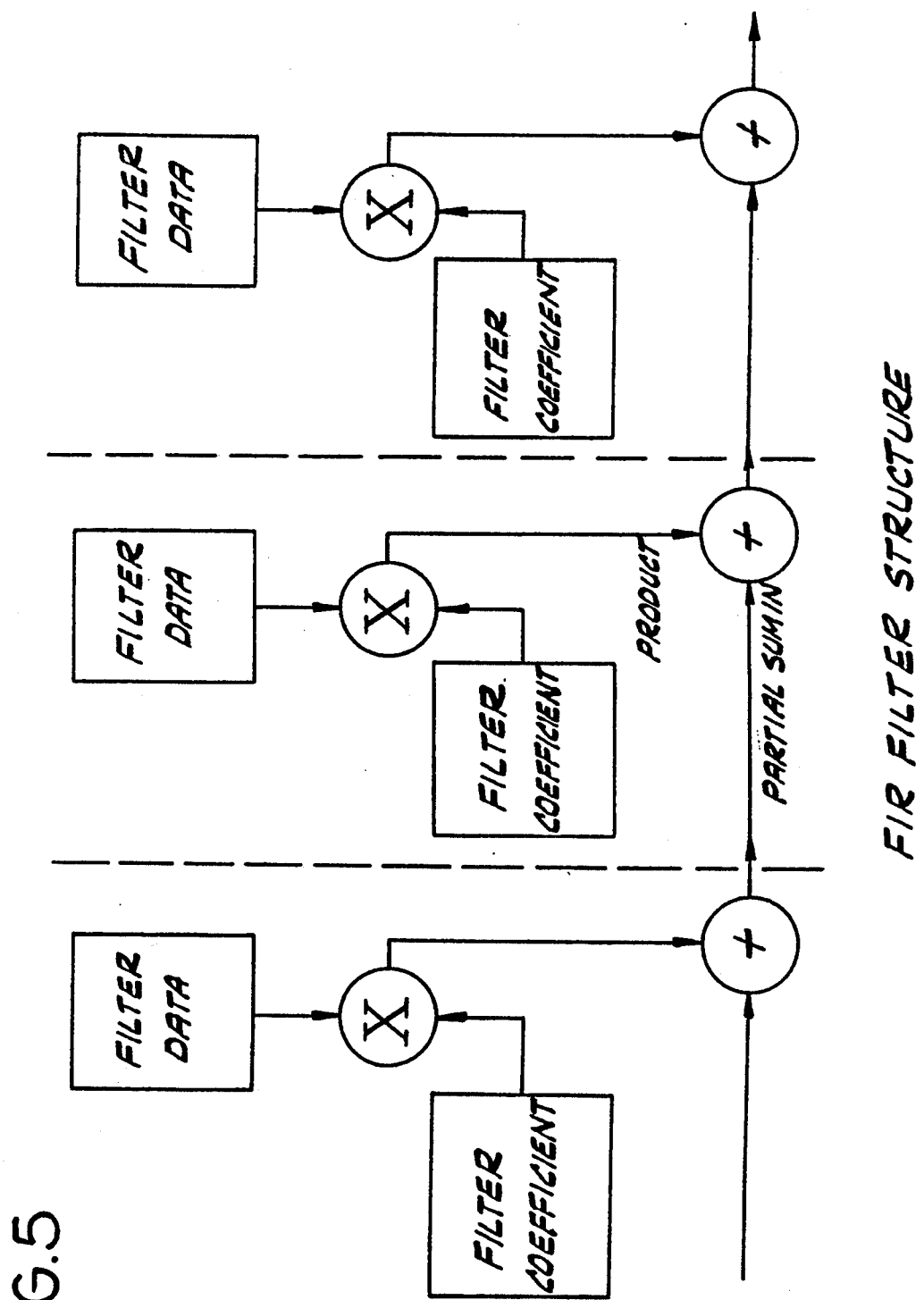
FIG. 5 is a block diagram of a conventional FIR filter structure.

As stated earlier, the implementation of digital filters is the primary task of the processor. An FIR filter, as illustrated in FIG. 5, can be viewed as a tapped delay line in which at each stage the incoming signal is held in a register, multiplied by a constant (filter coefficient), and the product added to the partial sum output of the previous stage. However, the multiplication requires repeated additions which consume time and scarce power. A logarithmic filter, such as 81 or 85 in FIG. 4, provides an advantageous alternative to the FIR filter in these respects. When the logarithmic filter is preceded by logarithmic signal conversion and followed by antilogarithmic signal conversion, the logarithmic filter causes the receiver 17 to produce substantially the same acoustic output that it would be caused to emit if a linear ADC/DAC with a filter-limit-filter using FIR prefilter and postfilter were used.

By processing logarithmically encoded data directly, filtering performance is improved, circuit area is reduced, and power consumption is minimized as a result of the shorter wordlength required. Furthermore, power is not improvidently wasted in converting the logarithmically encoded samples to a linear format before they can be processed by more conventional processors and re-compressing the output samples before they are expanded by a CODEC (coder-decoder).

Because the theory of the FIR filter is useful in studying the more advanced subject of the logarithmic filter, it is convenient to think in FIR terms when describing the logarithmic filter. However, it is emphasized that the actual circuitry and operations used in the two filters are very different.

In sign/logarithm arithmetic, multiplication becomes simple addition. This means that an add circuit executing an add operation is used in a logarithmic filter instead of a multiply circuit executing repeated add operations as in an FIR filter. Multiplication in a logarithmic filter is exact and introduces no roundoff error.

A logarithmic operation on two numbers A and B in the logarithmic filter which is analogous to adding two numbers X and Y, where A is log X by definition and B is log Y by definition, is understood by recognizing that $$X+Y=X(1+Y/X) \tag{1}$$

Accordingly, the logarithmic operation should compute a number C where $$C=\log(X+Y) \tag{2}$$

Substituting Equation (1), $$C = \log(X(1 + Y/X)) \quad (3)$$

By recognizing that the log of a product is a sum of logarithms of factors, and the log of a ratio is a difference D of logarithms of dividend and divisor, Equation (3) reduces to $$C = \log X + \log(1 + \text{antilog}(\log Y - \log X)) \quad (4)$$

Since by definition $A = \log X$, $B = \log Y$, and $D = B - A$, the logarithmic operation analogous to adding X and Y is given as $$C = A + \log(1 + \text{antilog} D) \quad (5)$$

where D is defined to be $$D = B - A \quad (6)$$

Consequently, the logarithmic add involves a first operation of a subtraction corresponding to Equation (6), which is electronically implemented by circuitry essentially similar to an add circuit. Second, an operation log (1 + antilog (D)) is performed electronically by a table lookup for instance. Third, the value A is electronically added by an add circuit to the result of the table lookup.

The term "Logarithmic Multiply Accumulate (LMA) cell" is used herein to refer to the electronic circuitry in a logarithmic filter which is very different from, but analogous to, a stage of multiplication and addition in an FIR filter. In an 8-bit VLSI realization of a single LMA cell of the present work, less than 25% of the table entries for purposes of the table lookup are non-zero. The table can be efficiently implemented as a programmable logic array (PLA). Roundoff error propagation associated with the accumulate operation is a factor which should be considered in using the lookup approach. With an 8-bit encoding and a sparse lookup table a dynamic range in excess of 100 dB and an RMS signal to RMS noise ratio of 31 dB is obtainable.

For convenience of description, the logarithmic operation analogous to adding in an FIR filter may be called "adding in the logarithmic domain" or "accumulating". Similarly, addition of logarithms may be called a "multiply" even though there is no repeated addition of them. The shorthand terminology also appears in the expression Logarithmic Multiply Accumulate (LMA) used above. However, it is emphasized that in the present context, the logarithmic multiply operation is not an electronic multiplication in the conventional sense of repeated addition. Furthermore, the logarithmic accumulate operation is not adding in the conventional sense of the term because a logarithmic value $A = 2$ when "added" to a logarithmic value of $B = 2$ is not a logarithmic value of 4. Instead it is 2.3010 . . . . Thus, in this example, $2 + 2$ equals 2,3010 . . . because $A - B = 2 - 2 = 0$; $\log(1 = \text{antilog}(0)) = \log(2) = 0.3010$ . . . and $C = A + \log(2) = 2 + 0.3010 \ldots = 2.3010 \ldots$. A logarithmic value $A = 3$ when "added" to a logarithmic value of $B = 2$ is neither a logarithmic value of 5 nor a logarithmic value of 3.

For the present purposes a logarithmic filter suitably has a series of filter stages with inputs and outputs in cascade and respective registers associated with the filter stages for storing electrical representations of filter parameters. The filter stages include electronic addition circuits for respectively adding the electrical representations of the filter parameters to the electrical signal to be filtered thereby producing a set of filter sum signals. At least one of the filter stages includes a logarithmic accumulate circuit for producing a filter signal in substantially logarithmic form at its output by nonlinearly combining a filter sum signal for that filter stage with a signal from an output of another filter stage.

For the reasons discussed above, the electronic hardware (or software when used) in a logarithmic filter is thus very different from that of the FIR filter.

A filter-limit-filter digital filter by its intervening limit operation also introduces a nonlinearity which makes the filter-limit-filter different from any mere linear filter such as the FIR (finite impulse response) filter, even when the prefilter and postfilter are linear and not logarithmic. If the combination of filter, limiter and filter were equivalent to any single FIR filter, economy and power dissipation considerations would dictate a reduction in the circuitry to such a single FIR filter, if it existed. However, no FIR filter exists which is equivalent to the filter-limit-filter, or sandwich filter.

Since the limit operation is set to prevent excessive signal levels that will routinely occur in hearing aid operation, the nonlinearity is pervasive, not to mention that the logarithmic analogy to addition implemented in the PLA is nonlinear. As a result the digital to analog converter does not produce an analog output in accordance with the filtered signal from the prefilter, nor is the output of the prefilter itself adapted to the frequency response of the microphone, receiver and ear. Due to the nonlinearity of the hard limiter, the postfilter does not process a signal in accordance with the signal from the analog-to-digital converted signal either. The logarithmic sandwich filter acts as a whole to more fully ameliorate hearing deficiencies and prevent painfully loud sounds from being emitted by the receiver than a linear system can.

An 8-bit LMA cell in CMOS (complementary metal oxide semiconductor) technology with a power supply of 5 volts and a minimum feature size of 3 micrometers illustratively has a power consumption of 20 microwatts. The cell includes the PLA lookup table, parameter registers that hold filter parameter values K for the logarithmic digital filter corresponding to the logarithms of linear FIR filter coefficients, and combinatorial logic circuitry. By avoiding the use of dynamic CMOS design styles, the cell consumes only a few microwatts when input vectors are changing at a very slow rate. In this manner, the processor conserves power when the hearing aid is in a quiet environment.

The LMA cell requires just over 1500 transistors in preferred embodiment. The area occupied by the cell is 2 square millimeters. Therefore, 32 of these multiply accumulate cells arranged in a linear systolic array easily fit on a 10 millimeter square chip. With a sampling rate of the system of 12.5 kHz, and the LMA circuit producing outputs at a 10 MHz rate, multiplexing the 32 LMA cells by factor of 8 provides suitable processing (256 FIR filter taps) for a four-channel, instantaneous-compression hearing aid with a power consumption of 5 milliwatts. This arrangement is called a Multiplexed Logarithmic Multiplier Accumulator Cell (MLMAC) wherein additional coefficient and data registers permit multiple LMA operations during a sampling period.

With a power supply voltage of 1.5 volts and state-of-the-art, 1 micrometer, VLSI fabrication, a power consumption of 200 microwatts is contemplated for the DSP chip 45. Using similar VLSI fabrication of the AIC chip 43, the overall power consumption of chips 43 and 45 together is on the order of a milliwatt.

Referring again to FIG. 4, the postfilter outputs of the four channels A, B, C and D of logarithmic sandwich filter 87 are combined by logarithmic accumulation in a logarithmic combined circuit 91, the output of which is supplied to the antilogarithmic DAC conversion operation in circuit 53. If adaptive feedback offsetting is omitted, the input from logarithmic ADC is directly supplied to each prefilter of channels A, B, C and D. FIG. 4, however, shows a more sophisticated arrangement for offsetting feedback by an all-hardware logarithmic filter 93 having its input connected to the output of logarithmic combiner 91. The log filter 93 has its output connected to a log combiner 95 to which the output of the logarithmic ADC is also connected. In this way, the log filter produces a signal in logarithmic form which offsets in log combiner 95 the feedback contribution in the microphone 13 output. The output of log combiner 95 is a combined signal input supplied to each of the four prefilters for channels A, B, C and D.

The filter parameters of the log filter 93 are continually varied by a logic circuit, or electronic control, 97 as necessary to simulate feedback path Hf and cancel the feedback even under changing physical conditions in daily use of the hearing aid by the hearing impaired person. A signal generating circuit 99 produces a signal Se distinct from in waveshape from, and uncorrelated with, the external sound received by microphone 13. Signal Se is weighted by adding the logarithm of a weight W1 to it before logarithmic accumulation in log combiner 91. Also, signal Se and the combined signal input from log combiner 95 are provided on separate lines to logic circuit 97. Logic circuit 97 compares the signal Se with combined signal input, which is an error signal in logarithmic form for adaptive filtering purposes, and updates parameters for log filter 93 accordingly.

It should be recognized that the logarithmic adaptive filter embodiment of FIG. 4 is a logarithmic analog of corresponding linear filter circuitry disclosed in parent U.S. Pat. No. 5,016,280 and incorporated herein by reference. Several embodiments with different connections and operations using the signal Se are shown in the parent application and are interpreted in their linear form. Also, it is additionally noted herein that each of the drawings of said parent application represents a system that is additionally interpreted and implemented in logarithmic form according to the principles stated herein.

Figure 6:
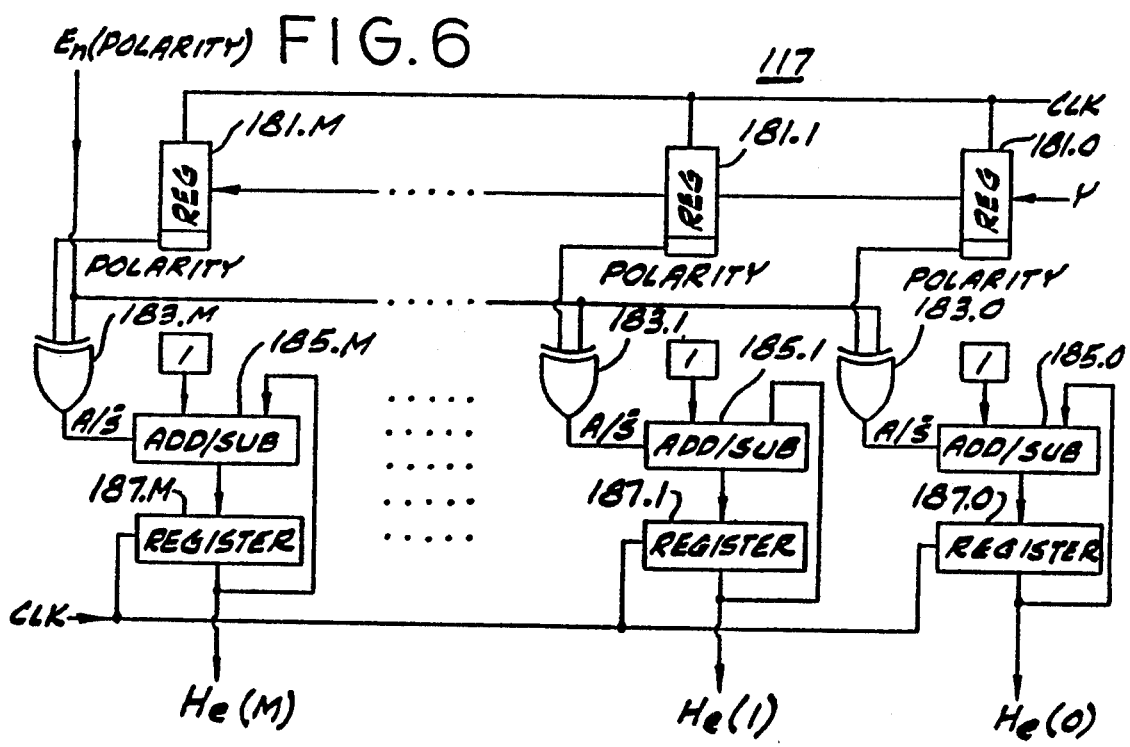
FIG. 6 is a partially block, partially schematic diagram of a logic circuit for controlling an inventive adaptive filter in FIG. 4.
Figure 7:
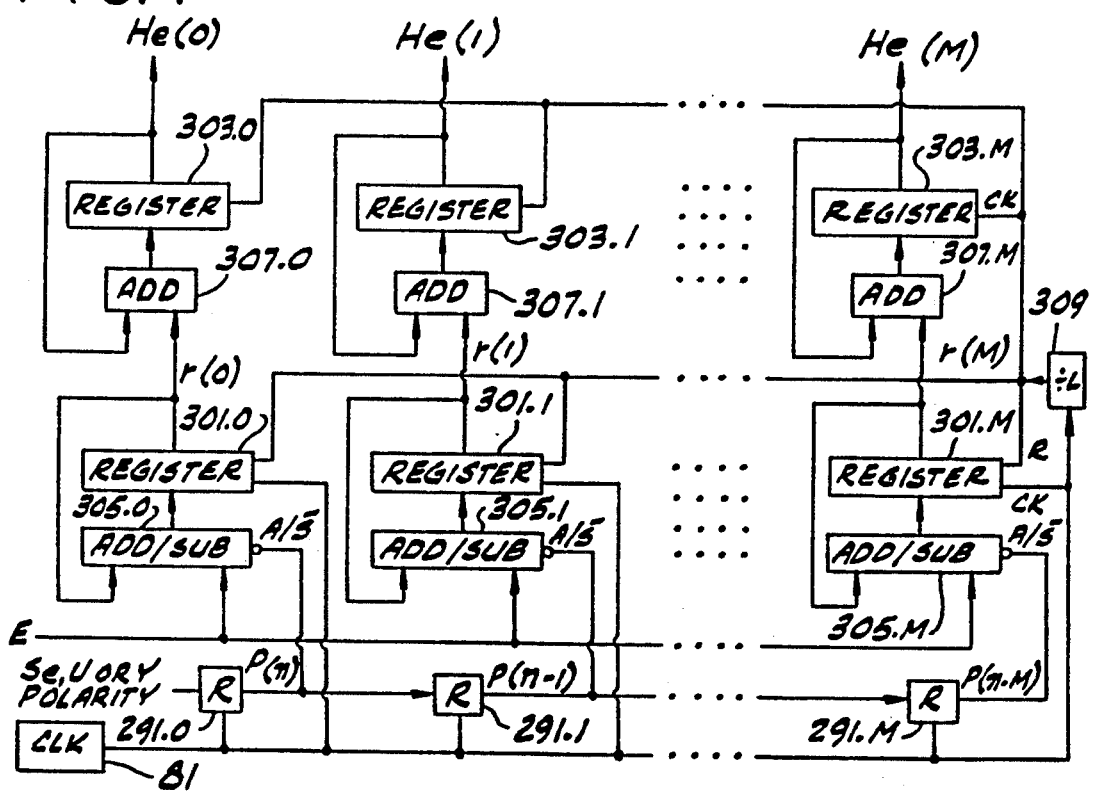
FIG. 7 is a partially block, partially schematic diagram of another form of logic circuit for controlling an inventive adaptive filter for simulating a feedback path.

FIGS. 12 and 24 of said parent application are reproduced herein as FIGS. 6 and 7 and the description of these Figures in the parent application is incorporated herein by reference with the rest of that parent application. FIGS. 6 and 7 illustrate two of many different possible alternative circuits for implementing logic circuit 97 of FIG. 4. The add/subtract circuits in FIGS. 6 and 7 are in one example provided as electronic adder/subtracters. In the logarithmic context, however, they operate as if they were multiplier/dividers in the linear domain because they add and subtract logarithmic signals. Advantageously, these circuits modify the filter parameters of logarithmic adaptive filter 93 in increments of log representation.

As shown in FIG. 8, the coefficients in the linear domain are adjusted in equal percentage increments, as a result of using the circuits from said parent application for controlling a logarithmic filter. The percentage increments are equal, for example, because adding a constant logarithmic amount to any number is equivalent to multiplying the linear number by a constant. Multiplying a number by a constant increases that number by a constant percentage, regardless of the number value. This results in a smaller error and statistical fluctuation for smaller coefficients as shown in FIG. 8 than would be the case in FIG. 9 representing the circuits of FIG. 6 and 7 for adaptively controlling an FIR filter that was described in said parent application CID 5512.

Filter 93 of FIG. 4 is thus an example of a logarithmic adaptive filter having electrically stored parameters representing coefficients in logarithmic form. Logic circuit 97 is an example of a linear control means for continually altering the coefficients to vary them in magnitude in substantially constant percentage amounts. The linear control means is interconnected with means for electronically filtering (e.g. logarithmic sandwich filter 87). The logarithmic adaptive filter further include means for electronic processing of a filtered signal and a distinct signal relative to the electrically stored coefficients to produce an adaptive output in logarithmic form to a first means for combining to substantially offset the feedback contribution in the electrical output of the microphone means in the electroacoustic system.

Log filter 93 suitably has a series of filter stages with inputs and outputs in cascade and respective registers associated with its filter stages for storing electrical representations of variable filter parameters corresponding to logarithms of values of adaptive filter coefficients. The filter stages respectively add the electrical representations of the filter parameters to the electrical signal from log combiner 91 to be filtered thereby producing a set of filter sum signals. Logarithmic accumulation in a filter stage produces a filter signal in substantially logarithmic form at its output by combining a filter sum signal for that filter stage with a signal from an output of its predecessor filter stage.

The electronic control circuitry of logic circuit 97 continually alters the electrical representations to vary each filter coefficient in magnitude in substantially constant percentage amounts of the value of that coefficient at any given time. For example, in FIG. 6 the electronic control circuitry responds to first and second externally derived control signals such as noise signal Se (or output Y from log combiner 91) and the polarity signal from log combiner 95 which both have respective changing polarities. Registers 181.0–.M temporarily store a series of values representing changing polarities of the first externally derived control signal. Each filter parameter is increased and decreased in magnitude by a constant amount in add/subtract circuits 185.0–.M. The increasing and decreasing respectively depend on whether a corresponding value in the series of values has the same or opposite polarity compared to the polarity of the second externally derived control signal (e.g. log combiner 95 output) currently. In this way, each coefficient, the logarithm of which is represented by each filter parameter, is increased and decreased in increments of a substantially constant percentage of each coefficient at any given time.

In FIG. 7, the electronic control circuitry has a first set of registers 301.0–.M for holding running totals that are incremented and decremented by add/subtract circuits 305.0–.M as a function of polarity of the log combiner 95 output and polarity of at least one signal (Se, U, or Y) from logarithmic sandwich filter 87. A second set of registers 303.0-.M hold digital values in logarithmic form representing each parameter. Add circuits 307.0-.M respectively add the running totals in the first set of registers to corresponding digital values in the second set of registers less frequently than the incrementing and decrementing of the first set of registers occurs.

In FIG. 10 a preferred electronic filter structure 400 implements logarithmic sandwich filter 87 of FIG. 4 for filtering an 8-bit electrical signal LOG SIGNAL such as the output of log combiner 95. In FIG. 10 a series of eight MLMAC filter stages 401, 402, . . . 407, 408 are responsive to the electrical signal and have 8 bit bus inputs D1 and 8 bit bus outputs Q1 in cascade. Each filter stage has a second bus input D2 and bus output Q2 (both 8 bits). Filter stage 408 has its output Q1 connected to its own second input D2, and the filter stages have their inputs D2 and outputs Q2 connected in cascade in reverse to the cascading of inputs D1 and outputs Q1.

Each filter stage 401–408 stores electrical representations of filter parameters K consecutively supplied in parallel form on a bus $K_{IN}$ 411.1 from host computer 69 of FIG. 4 and loads from stage to stage on buses 411.2-.8 in the manner of loading a long shift register. The series of filter stages 401–408 include other shift-register based circuits for filtering signals from the Q outputs through the series of filter stages from the first (401) to the last (408) of the filter stages and then filtering signals back through the series of filter stages from the last to the first of them to produce a filtered signal output in parallel form on an 8 bit bus 413.

As described, the series of filter stages 401–408 processes in two directions, forward and reverse. In fact, each particular filter stage processes filter signals in both directions with respect to each filter parameter in that particular filter stage. Advantageously, it is recognized herein as being desirable to make the logarithmic prefilter and postfilters analogous to a linear phase filter. In FIR filter theory, a linear phase filter has taps with filter coefficients which are symmetric with respect to the center of the series of taps. The logarithmic transformation does not disturb this symmetry, and the logarithmic filter parameters are advantageously also symmetric. For example, in a 32 tap logarithmic filter, parameter K0=K31, K1=K30, K2=K29, K3=K28, .. . K15=K16. The MLMAC stages are conceptually folded around the center of symmetry, so that the first stage 401 holds parameter K0 which is also used as K31. Further coefficient multiplexing in the first stage provides parameter K1 which is also used as K30. Second stage 402 holds parameters K2 and K3, which are also used as K29 and K28. In this way only 8 MLMAC stages act as a 32 tap logarithmic filter.

The 8 bit Q2 output bus 413 of first MLMAC stage 401 is connected to an 8 bit input bus 415 for a hard limit (H.L.) circuit 417, as well as to an 8 bit filter output bus 419. Hard limit circuit 417 responds to the bus 415 prefilter output part of the Q2 output of stage 401 to produce an intermediate output signal generally limited to a predetermined range of electrical values. This intermediate output signal is supplied on a bus H.L.OUT 429 to a 2-to-1 multiplexer 431. Multiplexer 431 has an 8 bit output bus 433 carrying each sample X in parallel digital form simultaneously to all of the filter stages 401–408 at once. Multiplexer 431 multiplexes the intermediate output signal on H.L.OUT bus 429 with LOG SIGNAL supplied on an input bus 435 so that the logarithmic filter stages 401–408 operate as both a logarithmic prefilter and a logarithmic postfilter.

Control for the logarithmic sandwich filter 400 of FIG. 10 is provided by a circuit 441 for generating clock pulses on the order of 10 MHz, a digital counter 443 for counting the clock pulses to produce a count output on a bus 445, and a decoder 447 for decoding the count output into control signals on six control lines 449 for coordinating the operations of each MLMAC stage, two control lines 451 for the hard limit circuit 417 and a line 453 for multiplexer 431.

Demultiplexing the output bus 413 onto buses 415 and 419 is accomplished by control signals on the control lines from decoder 447. For example, decoder 447 is connected by a line 455 to a latch 457. Decoder 447 only clocks latch 457 when a multiplexed digital signal representing postfilter output is pro, sent on bus 419, and not when the information on bus 419 is prefilter output intended for hard limit circuit 417. In this way way latch 457 is rendered insensitive to prefilter output which is not intended for it anyway. On the other hand, when prefilter output is present on buses 413 and 415, decoder 447 selects the hard limit output bus 429 input by activating control line 453 to the 2-to-1 multiplexer 431. At other times, multiplexer 431 is made to connect LOG SIGNAL to the MLMAC stages 401–408.

Advantageously, multiplexer 431 in FIG. 10 doubles the processing capabilities of MLMAC stages 401–408 by making them act as both prefilter and postfilter to the hard limit circuit 417 and thereby even more efficiently implement logarithmic sandwich filter 87 of FIG. 4. It is emphasized that this multiplexing provided by multiplexer 431 is additional to multiplexing within each MLMAC stage, further described next, and thus provides another important contribution to the practical implementation of the logarithmic sandwich filter 87.

Figure 11:
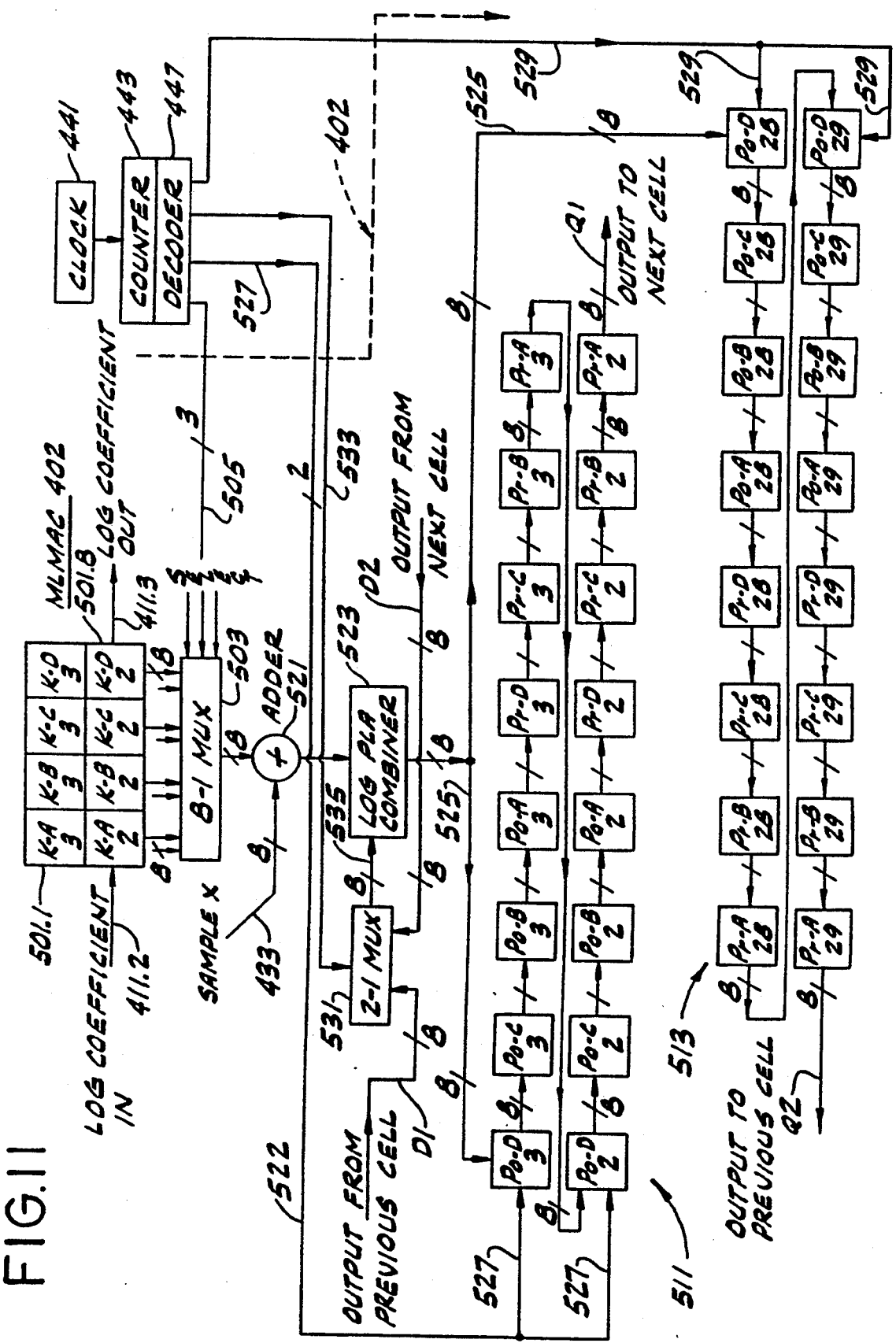
FIG. 11 is a block diagram of a multiplexed logarithmic multiply accumulate cell (MLMAC) of the invention and used in several blocks in FIG. 10.

In FIG. 11 a representative circuit 402 of each MLMAC filter stage has eight registers 501.1-.8 for storing digital representations of a number of filter parameters in association that individual filter stage. Each of the eight registers holds an eight bit representation of a respective filter parameter. The filter parameters are indexed according to their channel A, B, C or D. Two filter parameters for each channel are stored in association with each filter stage for the total of eight registers 501.1-.8. Advantageously, therefore, the channels are multiplexed as well as a pair of parameters for each channel in each filter stage.

An 8-to-1 multiplexer 503 receives 64 lines from the registers 501.1-.8 and is operated by three control lines 505 from decoder 447. Multiplexer 503 and decoder 447 multiplex the operations of each individual filter stage with respect to the digital representations of the parameters so that the filter 401–408 of FIG. 10 operates as a plurality of bandpass filters equal in number to the number of filter parameters for different channels associated with each filter stage, e.g., the number of channels themselves. Decoder 447 coordinates the operations of each filter stage and causes the multiplexer 503 in each filter stage to select corresponding filter parameters by channel in all of the filter stage means at once in accordance with values of an index represented in parallel digital form on the three select lines 505. In this way, operations are multiplexed so that the filter as a whole operates as a plurality of bandpass filters, and each bandpass filter has a filter characteristic defined by the set of filter parameters in the filter stages selected according to the same value of the index.

In FIG. 10 the filter stages are in predecessor-successor relationship electrically speaking (without regard to actual placement on the VLSI die). For example, MLMAC stage 401 is a predecessor, or previous cell, to MLMAC stage 402; and MLMAC stage 403 is a successor, or next cell, relative to MLMAC stage 402.

In FIG. 11 signals are filtered through the series of stages 401–408 by first and second 16-cell shift registers 511 and 513. Each shift register 511 and 513 holds 8 bits of parallel digital information in each cell and acts as a 16 stage FIFO (first-in-first-out) structure for whole bytes. In other words, each shift register holds 8 bits times 16 cells or 128 bits in all. The 16 cells in shift register 511 are cascaded for translating filter signals for both prefilter and postfilter purposes in all four filter channels A, B, C and D to a successor filter stage in the series 401–408. Second shift register 513 also has 16 cascaded cells for transfering further filter signals for both prefilter and postfilter purposes in all four filter channels A, B, C and D to a predecessor filter stage in the series. The 16 cells thus accommodate 2 filters×4 channels×2 taps=16 bytes.

Processing in FIG. 11 is performed by an adder 521 and log PLA combiner 523. Adder 521 is fed by an 8 bit bus from 8-to-1 multiplexer 503 to which 8 bit sample X on bus 433 is added. An 8-bit output sum from adder 521 is fed to log PLA combiner 523 which supplies an 8 bit result on a data bus 525 to both shift registers 511 and 513. Decoder 447 clocks all of the cells in shift register 511 by a control signal on a line 527 when shift register 511 is to receive the result from combiner 523. Decoder 447 clocks all of the cells in shift register 513 by a control signal on a line 529 when shift register 513 is to receive the result from combiner 523. Clocking moves the contents in the 16 cells ahead by one cell and delivers a latest sample at 8 bit output Q1 of shift register 511 or 8 bit output Q2 of shift register 513 to the successor or predecessor filter stage. The entire filter assembly with its repeated synchronized data moves in all filter stages comprise a systolic array implementation.

A 2-to-1 multiplexer 531 has first and second 8 bit input buses D1 and D2 respectively connected to the predecessor and successor filter stages as shown in FIG. 10. Thus input bus D1 is connected to a first shift register in the predecessor filter stage analogous to 511 and to a second shift register in the successor filter stage analogous to 513. Multiplexer 531 selects bus D1 or D2 under control of decoder 447 on a line 533, to feed log PLA combiner 523 on an 8 bit bus 535.

Adder 521 and log PLA combiner 523 thus act as an electronic processer that adds each electrical representation of a filter parameter to the electrical signal X to be filtered thereby producing a filter sum signal for combiner 523. Combiner 523 produces a filter signal in substantially logarithmic form for the first or second shift register (511 or 513 respectively) by nonlinearly combining the filter sum signal with a signal from the multiplexer 531 derived from the first shift register in the predecessor filter stage or from the second shift register in the successor filter stage respectively.

The entries Pr (prefilter) and Po (postfilter) followed by channel designations (A, B, C, D) and coefficient numerals in the boxes of the shift registers 511 and 513 specify the order (working from Q output back through the cells) in which the decoder 447 is set to call out parameters from the 8-to-1 multiplexer 503 and to operate the 2-to-1 multiplexer 431 of FIG. 10. In the prefilter mode, multiplexer 431 of FIG. 10 is caused to select input line 435 LOG SIGNAL, and decoder 447 selects the channels in order on lines 505 for a given parameter number. On each channel select operation, decoder 447 operates line 527 to cause multiplexer 531 to select output from previous cell on input D1 (tap i) and then select output from next cell on input D2 (tap 31-i). Concurrently in the same channel select operation, decoder 447 activates line 529 to clock the tap i result into the shift register 511 and then to activate line 527 to clock the tap 31-i result into the shift register 513.

In the postfilter mode, multiplexer 431 of FIG. 10 is caused to select input line 429 H.L.OUT, and decoder 447 selects the channels in order on lines 505 for the given parameter number, with multiplexer 531 and shift registers 511 and 513 operating within each channel select operation as described. Then the decoder 447 proceeds to the second coefficient and executes the prefilter channel selects and then the postfilter channel selects all over again. This completes a full cycle, which is repeated endlessly. It should be understood that the legends in the shift register cells indicate the order and position of the data when prefilter-channel-A-coefficient 2 is in the cell nearest output Q1. During the rest of the cycle the data is shifted through the cells continually in the manner of a cyclic buffer store.

FIG. 12 shows more details of hard limiter 417 of FIG. 10. Hard limiter 417 acts as limiting means, responsive to a signal from an output of a filter stage in said series, for producing a filtered signal output generally limited to a predetermined range of electrical values. Multiplexer 431 is connected to the first of the filter stages in FIG. 10 and multiplexes the filtered signal output of the hard limiter 417 with the electrical signal to be filtered so that the electrical signal is prefiltered through the series of filter stages and back again, then limited by hard limiter 417, and then postfiltered through the series of filter stages and back again.

Hard limiter 417 in FIG. 12 has four storage registers 551 for holding electrical representation of a boost value for each filter channel A, B, C and D. The appropriate boost value is selected from registers 551 by a 4-to-1 multiplexer 555 which is controlled by decoder 447 by two select lines 451 which are suitably connected to two channel select lines in lines 505 or otherwise as appropriate. A digital adding circuit 553 is connected to the output of multiplexer 555 for electrically adding to, or increasing, the 8 bit digital signal on bus 415 with the digital representation of the boost value for the selected channel. Adding circuit 553 produces a first output signal on a line 557 having a variable level depending on the magnitude of the boost value and the magnitude of the digital signal on bus 415. Adding circuit 553 has a maximum value, such as 11111111 of which it is capable, so its output does not exceeding that maximum output level. A digital subtractor 559 has its subtracting (−) input connected to the 8 bit line from the multiplexer 555, and its plus (+) input connected to the output of adding circuit 553. Subtractor 559 decreases the first output signal from the adding circuit 553 by the digital representation of the boost value for the channel to produce a limiter output. The limiter output represents the same magnitude as the electrical signal on bus 415 unless the electrical signal exceeded a predetermined magnitude inversely related to the boost value. Specifically, if the maximum level of which adding circuit 553 is capable is designated MAX, then the hard limit value HL imposed on the magnitude of the signal to be limited is MAX less the boost value, or HL=MAX−BOOST. If the magnitude of the signal exceeds HL, then the limiter output is HL. If the magnitude of the signal does not exceed HL, then the limiter output is the magnitude of the signal unchanged. In overall operations, the circuitry of FIGS. 12 and 10 is suitably arranged to multiplex the operations of each individual filter stage for filtering with respect to each of the plurality of filter parameters for that individual filter stage and for concurrently multiplexing, for the means for increasing (e.g. adding circuit 553) and said means for decreasing (e.g. subtracting circuit 559), the electrical representations of the boost values from storage means so that the boost values for limiting purposes respectively correspond to particular filter parameters.

Turning to FIG. 13, an ADC-DAC logarithmic conversion circuit based on a charge-redistribution technique is believed to be the most suitable for low-power applications. The circuit is uncomplicated, has extremely low power consumption, and feasible to implement in VLSI. The ADC and DAC are implemented with a logarithm base d=0.941. This corresponds to an RMS Signal-to-Noise Ratio (SNR) of 35.1 dB, a dynamic range 67.1 dB with an accuracy of 3% with regard to the filter coefficients. Another logarithm base d=0.908 with the wordlength of 8 bits was also studied. This corresponds to an RMS Signal-to-Noise Ratio of 31.1 dB, and a dynamic range of 106 dB with an accuracy of 4.9% with regard to the filter coefficients. These performance parameters are based on the input quantization only and do not include degradation due to the signal processing. The logarithm base is selected by the skilled worker with a tradeoff between dynamic range and SNR in mind. An embodiment with base d=0.941 appears to be preferable for the hearing aid purposes, and the same base d should be used in both the DSP and ADC/DAC circuits.

The logarithmic D/A conversion is based on a charge-redistribution technique, which uses two unequally weighted capacitors $C_1$ and $C_2$ in FIG. 13.

Prior to a D/A cycle, capacitor $C_1$ is precharged to a reference voltage ($V_{ref}$) by closure of switch $S_1$, and capacitor $C_2$ is discharged completely by closure of switch $S_2$. During a phase 1 of an input clock, with switches $S_1$ and $S_2$ open, a switch $S_3$ is closed and the charge on capacitor $C_1$ is redistributed to capacitor $C_2$. After redistribution the voltage on the capacitors is:

$$V_1 = V_{REF} \times C_1/(C_1+C_2)$$

$$d = C_1/(C_1+C_2)$$

During phase 2 of the clock, switch $S_3$ is opened and switch $S_2$ is closed; thereby discharging capacitor $C_2$ completely. The residual voltage on capacitor $C_1$ is now $V_1$ (as given above). On the next phase 1, switch $S_3$ is closed once again to redistribute the charge. The resulting voltage across the capacitors is:

$$V_2 = (C_1/(C_1+C_2))^2 \times V_{REF} = d^2 \times V_{REF}$$

The process is continued in this fashion for n clock cycles, after which the final voltage on capacitor $C_1$ is given by:

$$V_n = (C_1/(C_1+C_2))^n \times V_{REF} = d^n \times V_{REF}$$

The ratio 'd' corresponds to the base of logarithms for the system. For a base d=0.941, the capacitor values chosen are $C_1 = 32$ pF and $C_2 = 2$ pF.

An 8-bit counter monitors the number of clock cycles used. The 7-bit digital word that is to be converted is compared with the lower 7 bits of the counter. When equal, the clock to the switches is disabled. The residual voltage on capacitor $C_1$ corresponds to the analog equivalent of the input digital word.

For analog-to-digital conversion, the analog signal is sampled and the sample is compared with the analog output of the DAC. When equal, the clock to the switches in the D/A converter is stopped and at the same time the counter value is latched. This 7-bit word is the digital equivalent of the input analog sample. The clock to the switches is disabled if the digital comparator fires, or the input digital word is equivalent to zero, or if the analog comparator fires.

This basic logarithmic converter of FIG. 13 can be made more efficient in terms of speed of operation by the addition of another capacitor $C_3$(2pF), which like $C_2$ is also used for discharging capacitor $C_1$. (See FIG. 14) The two capacitors $C_2$ and $C_3$ are used alternately to discharge capacitor $C_1$; i.e., when the charge on capacitor $C_1$ is being shared with capacitor $C_2$, capacitor $C_3$ is discharged and vice versa. This results in twice the original conversion speed.

A block-schematic diagram of a preferred version of a logarithmic ADC-DAC 601 is shown in FIG. 14. Here an 8-bit counter 611 is used with a decoder 613 to generate the required control and timing signals. Counter 611 is asynchronous and is operated from an oscillator 615 with a clock frequency of 4 MHz. A least significant bit ($Q_0$) of counter 611 provides a 2 MHz input to a two phase clock generator. The two phases are then used to control numerous switches of the logarithmic signal conversion circuitry 601. All 8 bits ($Q_0$ to $Q_7$) of the counter 611 are connected to a digital comparator 621 and to an output latch 623.

Each conversion cycle illustratively takes 40 microseconds with 4 MHz time base. On supplying power to the circuit, the counter 611 is reset, the capacitor C1 is charged, and a D/A cycle is initiated. In analog-to-digital conversion a Sample.H high signal is asserted and used to sample an anti-aliased analog input signal from microphone 13. An analog comparator 651 compares the voltage on capacitor C1 with the analog input voltage via operational amplifier and switching circuitry 653. When the analog comparator 651 fires, the counter 611 value at that instant is latched into latch 623. Since the analog comparator output is asynchronous, it is latched by a D flip-flop in latch block 623. The output of the D flip-flop enables or disables the latch 623.

During a D/A cycle an input latch 631 holds a digital word from the DSP chip For conversion to analog form. The outputs of the counter 611 and the latch 631 are compared by the digital comparator 621, whose output goes high when the count value is same as the input word. This comparator output signal disables the clock to the switches, and capacitor $C_1$ thereupon holds the analog voltage to which the digital value in latch 631 is converted. A sample-and-hold (S/H) circuit 641 is ennobled and sample the analog voltage on capacitor $C_1$ and hold it as the analog output of the logarithmic DAC.

Some design and layout considerations are next discussed. It is possible to implement accurate capacitor ratios in MOS technology. The electrodes of MOS capacitors can be realized in the following ways:

1. Metal or Polysilicon-over-diffusion structure In this structure a thin layer of SiO$_2$ is grown over a heavily doped region in the substrate. This doped region forms the bottom plate of the capacitor and the top plate is formed by covering the SiO$_2$ with metal or polysilicon. The variation in oxide thickness is usually within ±15% causing a 0.1% error in the capacitance value.
2. Polysilicon-over-Polysilicon structure In a silicon-gate "double poly" process, a second layer of low resistivity polysilicon is used as an interconnect or for the formation of a floating gate for memory application. These two poly layers can be used as the plates of a capacitor. A major disadvantage of this type of capacitor is the random variation in oxide thickness caused by the granularity of the polysilicon surface causing a 0.12% error in the capacitance value. The ratio of capacitance to area for this type of structure is smaller than that of a Metal or Polysilicon-over-diffusion structure.
3. Metal-over-Polysilicon structure The two plates of the capacitor are metal and polysilicon. The properties of this type of capacitor are similar to the polysilicon-over-polysilicon structure.

In all the above structures, there is a large parasitic capacitance from the bottom plate of the capacitor to the substrate, and thus to the substrate bias. In the case of the metal or polysilicon over diffusion capacitor, where the bottom plate is embedded in the substrate, this stray capacitance is that of a reverse biased p-n junction and can be 15–30% of the total capacitance (C), depending on the oxide thickness and the construction of the device. For the "double poly" and metal-over-polysilicon structures the stray capacitance associated with the bottom plate is typically 5–20% of C.

The accuracy of the logarithmic D/A converter depends on the accuracy of the ratio $(C_1/(C_1+C_2))$. The capacitance ratio is affected by the inaccuracies of the capacitances themselves. Errors in the ratio are due to change in area (random edge variations), the oxide thickness of the capacitors, and the "undercut". This undercut is due to the lateral etching of the plates of the capacitor along its perimeter during fabrication. It decreases C, which is proportional to the perimeter of the device. A common approach to avoid this undercut is to connect identically sized small "unit" capacitors in parallel to construct a larger one. Using this technique the area/perimeter ratio is nearly the same for any two capacitors. However, these capacitors occupy large areas since they utilize only 60% of the available space. A typical layout of a capacitor is cross-shaped. The capacitors $C_1$, $C_2$, and $C_3$ are implemented with similar layouts.

In its digital to analog conversion aspect, electronic signal conversion apparatus is provided in FIG. 14 which has a circuit 631 for temporarily holding a digital value which is to be converted to analog form. First and second capacitors C1 and C2 are provided. Switches are generally operable for executing selective operations including selectively charging at least one of the first and second capacitors, selectively discharging at least one of the first and second capacitors, and selectively connecting the first and second capacitors so that a redistribution of charge between them occurs. In FIG. 14 switch POS SGN and PRE A2D act as a first switch generally operable for charging first capacitor C1 to a first voltage from the source of voltage. Switch PHS2 discharges second capacitor C2 to a voltage level different from the voltage to which first capacitor C1 is charged. A third switch A2D connects first capacitor C1 so charged to second capacitor C2 so that a redistribution of charge occurs and the voltage across first capacitor C1 is reduced to a predetermined fraction of the first voltage.

Decoder 613 responds to counter 611 for repeatedly operating the second and third switches PHS2 and A2D alternately so that the voltage across first capacitor C1 is repeatedly reduced by the predetermined fraction a number of times, the number being represented by the digital value held in the latch 631, so that the voltage remaining across first capacitor C1 after being reduced for that number of times is an analog voltage to which the digital value is converted. The analog voltage to which the digital value is converted is substantially proportional to a first constant d to a power number N where N is substantially proportional to the number of times that the first and second capacitors are connected, or the number of redistribution operations performed by the switches in a particular conversion. The number N is a direct function of and proportional to the digital value which is to be converted to analog form, so that the voltage across at least one of the capacitors C1 and C2 after the operations are executed is an analog voltage to which the digital value is converted. It is believed that the value d is preferably established between 0.85 and 0.99. In most cases, the capacitance C1 is preferably at least ten times the capacitance C2.

In the analog to digital conversion aspect decoder 613 operates the switches to make them perform a sequence of the selective operations among which operations the redistribution of charge repeatedly occurs a number of times until a predetermined electrical condition, involving the sample of the analog signal, occurs. Circuitry produces a digital value as a function of the number of times the redistribution of charge occurs, so that the digital value so produced when the operations are executed is the digital value to which the sample of the analog signal is converted. For example, counter 611 continually increments a count of a number proportional to the number of times the selective operation of redistributing charge occurs. Electronic comparing circuitry 653 and 651 responds to the voltage across the first capacitor C1 reaching a particular level and supplying a control signal on a line 661 to data latch 623 to latch the count from counter 611 when the level is reached.

Figure 15:
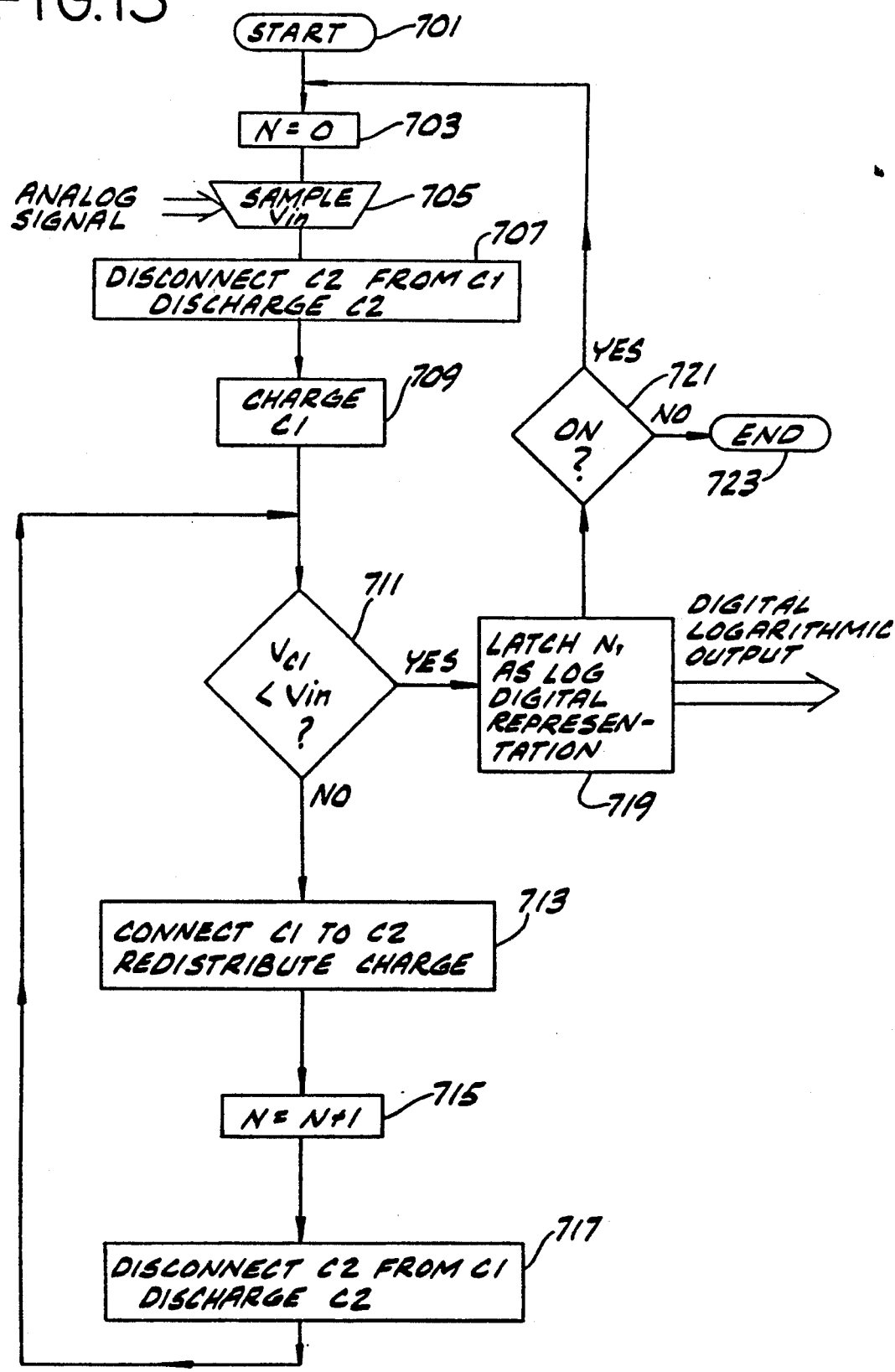
FIG. 15 is a process flow diagram illustrating some inventive methods for operating a logarithmic ADC-/DAC conversion apparatus of the invention.

A process diagram of FIG. 15 shows illustrative operations of logarithmic A/D signal conversion. Operations commence with a START 701 and proceed to a step 703 to reset a counter value N to zero. The analog signal is sampled in a step 705. Step 707 disconnects C2 from C1 and discharges the second capacitor to a voltage level different from the voltage to which the first capacitor is charged. Then a step 709 charges the first capacitor to a first voltage from the source of voltage.

A test step 711 determines whether the voltage across first capacitor C1 is less than the level sampled in step 705. If not operations proceed to a step 713 to connect the first capacitor so charged to the second capacitor so that a redistribution of charge occurs and the voltage across the first capacitor is reduced to a predetermined fraction of its previous voltage. Then a step 715 increments the counter index N. Step 717 disconnects C2 from C1 and again discharges the second capacitor to a voltage level different from the voltage to which the first capacitor is charged. Operations return to test step 711 and until the test is satisfied, repeatedly perform the discharging and connecting steps alternately (713–717) so that the voltage across said first capacitor is repeatedly reduced by the predetermined fraction a number of times, the number being represented by the digital value N. When the test of step 711 is satisfied, the voltage remaining across the first capacitor after being reduced for that number of times is an analog voltage to which the digital value corresponds. Operations branch from step 711 to a step 719 to latch index N as the log digital representation and provide it as output. D/A conversion operates conversely. Operations loop back to step 703 through a test 721 if the process is to continue. If not, operations branch from test 721 to an END 723.

The invention comprehends numerous embodiments using digital or analog technology and incorporating software, hardware, or firmware as applications dictate. Applications, combinations and processes for hearing aids, public address systems and other electronic systems generally for use in air, underwater, space or in other environments are within the scope of the invention.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a scope-limiting sense.

What is claimed is:

1. Electronic signal conversion apparatus comprising:
    means for temporarily holding a sample of an analog signal which is to be converted to a digital value;
    first and second capacitors;
    switch means generally operable for executing selective operations including selectively charging at least one of the first and second capacitors, selectively discharging at least one of the first and second capacitors, and selectively connecting the first and second capacitors so that a redistribution of charge between them occurs;
    means for operating said switch means to make it perform a sequence of the selective operations among which operations the redistribution of charge repeatedly occurs a number of times until a predetermined electrical condition, involving the sample of the analog signal, occurs; and
    means for producing a digital value as a function of the number of times the redistribution of charge occurs, so that the digital value so produced when the operations are executed is representative of the digital value to which the sample of the analog signal is converted.

2. Electronic signal conversion apparatus as set forth in claim 1 wherein said means for producing a digital value operates by incrementing a count of a number proportional to the number of times the selective operation of redistributing charge occurs, and stopping said incrementing when the predetermined electrical condition occurs.

3. Electronic signal conversion apparatus as set forth in claim 1 wherein said predetermined electrical condition is based upon the voltage across the first capacitor reaching a particular level.

4. Electronic signal conversion apparatus as set forth in claim 1 wherein said means for producing a digital value includes counter means for continually incrementing a count and said means for operating said switch means includes decoder means responsive to the count of said counter means for generating a series of control signals in sequence for said switch means.

5. Electronic signal conversion apparatus as set forth in claim 1 wherein the capacitance of the first capacitor is at least ten times the capacitance of the second capacitor.

6. Electronic signal conversion apparatus as set forth in claim 1 wherein the capacitance of the first capacitor divided by the sum of capacitance of the first and second capacitors is a ratio d representing a base of logarithms of the conversion.

7. Electronic signal conversion apparatus as set forth in claim 1 wherein the capacitance of the first capacitor divided by the sum of capacitance of the first and second capacitors is a ratio d representing a base of logarithms of the conversion and the voltage across the first capacitor varies as a power N of the ratio d and the power N is substantially proportional to the number of redistribution operations performed by said switch means in a particular conversion.

8. The signal conversion apparatus as set forth in claim 1 further comprising:
    storing means for holding an electrical representation of a boost value;
    means connected to said storing means for electrically increasing the produced digital value with the digital representation of the boost value, said means for electrically increasing producing a first output signal having a variable level depending on the magnitude of said boost value and the produced digital value and not exceeding a maximum output level of which said means for increasing is capable; and
    means, connected to said storing means and to said means for increasing, for decreasing the first output signal by the digital representation of said boost value to produce a limiter output which represents the same magnitude as the produced digital value unless the produced digital value exceeds a predetermined magnitude inversely related to the boost value.

9. The signal conversion apparatus set forth in claim 8 wherein said storing means includes means for holding a plurality of electrical representations of boost values and further comprising filter means having a series of filter stages in cascade and respective means associated with said filter stages for storing a plurality of electrical representations of filter parameters for each individual filter stage; and means for multiplexing the operations of each individual filter stage for filtering with respect to each of the plurality of filter parameters for that individual filter stage and for concurrently multiplexing, for said means for increasing and said means for decreasing, the electrical representations of the boost values from said storing means so that the boost values for limiting purposes respectively correspond to particular filter parameters.

10. The signal conversion apparatus as set forth in claim 1 further comprising:
    a microphone for generating the analog signal as a function of sounds external to the apparatus;
    an electrically driven receiver for emitting sound; and a logarithmic filter-limit-filter circuit having a digital input and a digital output, wherein the producing means is connected for providing the produced digital value to the digital input of said logarithmic filter-limit-filter circuit and wherein the receiver is connected for receiving a signal via the digital output of said logarithmic filter-limit-filter circuit for driving said receiver.

11. The signal conversion apparatus as set forth in claim 1 further comprising:
   a microphone for generating the analog signal from sounds external to the apparatus;
   an electrically driven receiver for emitting sound, some of the sound emitted by the receiver returning to the microphone to add a feedback contribution to the analog signal;
   wherein the producing means produces the digital value as a function of the analog signal generated by the microphone;
   first means for combining said digital value with an adaptive output in logarithmic electrical representation to produce a combined signal input including a first polarity signal;
   means for electronic processing of the combined signal input in logarithmic form to produce an intermediate signal in logarithmic form;
   means for generating a noise signal including a second polarity signal; and
   second means for combining the intermediate signal with the noise signal to drive the receiver, said means for electronic processing also including adaptive filter means for electronic processing of the intermediate signal and the noise signal to produce the adaptive output in logarithmic form to said first means for combining to substantially offset the feedback contribution in the analog signal generated by the microphone.

12. The signal conversion apparatus as set forth in claim 11 wherein said adaptive filter means comprises
   all-hardware logarithmic digital filter means for processing the intermediate signal and the noise signal in accordance with a series of digital parameters to produce the adaptive output in logarithmic form for said first means for combining; and
   logic circuit means for adaptively varying the digital parameters of the all-hardware logarithmic digital filter means so that the adaptive output substantially offsets the feedback contribution.

13. The signal conversion apparatus as set forth in claim 12 wherein said means for electronic processing also includes all-hardware digital filter-limit-filter means for processing the combined signal input in logarithmic form in accordance with a second series of digital parameters to produce the intermediate signal.

14. Electronic signal conversion apparatus comprising:
   means for temporarily holding a sample of a first analog signal which is to be converted to a first digital value;
   means for temporarily holding a second digital value which is to be converted to an analog level of a second analog signal;
   first and second capacitors;
   switch means generally operable for executing selective operations including selectively charging at least one of the first and second capacitors, selectively discharging at least one of the first and second capacitors, and selectively connecting the first and second capacitors so that a redistribution of charge between them occurs;
   means for operating said switch means to make it perform a sequence of the selective operations among which operations the redistribution of charge repeatedly occurs a number of times until a predetermined electrical condition, involving the sample of the first analog signal, occurs;
   means for producing a digital value as a function of the number of times the redistribution of charge occurs, so that the digital value so produced when the operations are executed is the first digital value which is representative of the sample of the first analog signal; and
   means, responsive to said means for temporarily holding the second digital value which is to be converted to an analog level of a second analog signal, for operating said switch means to make it perform a sequence of the selective operations among which operations the redistribution of chargerepeatedly occurs a distinct number of times, wherein the distinct number is a function of the second digital value which to be converted to an analog level of the second analog signal, so that the voltage across one of said capacitors after the operations are executed is representative of the analog level of the second analog signal to which the second digital value is converted.

15. The signal conversion apparatus as set forth in claim 14 further comprising:
   first and second VLSI dies;
   wherein said first and second holding means, first and second capacitors, switch means, first and second operating means and producing means are fabricated on said first VLSI die; and
   a logarithmic filter-limit-filter circuit fabricated on said second VLSI die and having a digital input and a digital output respectively connected to said producing means and to said second holding means on said first VLSI die.

16. The signal conversion apparatus as set forth in claim 15 wherein said logarithmic filter-limit-filter circuit includes logarithmic filter means having a series of filter stages with inputs and outputs in cascade and respective means associated with said filter stages for storing electrical representations of filter parameters, said filter stages including means for respectively adding the electrical representations of the filter parameters to the digital input thereby producing a set of filter sum signals, at least one of said filter stages including means for producing a filter signal in substantially logarithmic form at its output by combining a filter sum signal for that filter stage with a signal from an output of another filter stage;
   limiting means, responsive to a signal from an output of a filter stage in said logarithmic filter means, for producing a limiter output signal generally limited to a predetermined range of electrical values; and
   means for multiplexing the limiter output signal with the digital input so that said logarithmic filter means operates as both a logarithmic prefilter and a logarithmic postfilter.

17. The signal conversion apparatus as set forth in claim 15 wherein said logarithmic filter-limit-filter circuit includes an electronic filter having a series of filter stage means responsive to the digital input and having inputs and outputs in cascade, means for storing electrical representations of filter parameters for said filter stage means, and said series of filter stage means including means for filtering signals through the series of filter stage means from a first to a last of said filter stage means and then filtering signals back through said series of filter stage means from the last to the first of said filter stage means.

18. The signal conversion apparatus set forth in claim 15 further comprising adaptive logarithmic filter means fabricated on one of said VLSI dies and interconnected with the circuitry on said first VLSI die and with said logarithmic filter-limit-filter circuit.

19. The signal conversion apparatus as set forth in claim 14 further comprising:
- a microphone for generating the first analog signal from sounds external to the apparatus;
- an electrically driven receiver for emitting sound as a function of the second analog signal; and
- a logarithmic filter-limit-filter circuit having a digital input for receiving the produced digital value and having a digital output for outputting a digital signal as the second digital signal to the second holding means.

20. A method of operating an analog-to-digital converter for converting an analog signal to digital form using first and second capacitors, comprising the steps of:
- temporarily holding a sample of said analog signal which is to be converted to a digital value in said first and second capacitors;
- selectively discharging at least one of the first and second capacitors, and selectively connecting the first and second capacitors so that a redistribution of charge between them occurs; and
- performing a sequence of the selective operations among which operations the redistribution of charge repeatedly occurs a number of times until a predetermined electrical condition, involving the sample of the analog signal, occurs so that a digital value is produced which is representative of the digital value of the sample of the analog signal.

* * * * *